(12) United States Patent
Yoshikawa et al.

(10) Patent No.: US 7,164,592 B2
(45) Date of Patent: Jan. 16, 2007

(54) SEMICONDUCTOR DEVICE

(75) Inventors: Yasuhiro Yoshikawa, Kodaira (JP); Motoo Suwa, Saitama (JP); Hiroaki Nambu, Sagamihara (JP)

(73) Assignee: Renesas Technology Corp., Tokyo (JP)

( * ) Notice: Subject to any disclaimer, the term of this patent is extended or adjusted under 35 U.S.C. 154(b) by 46 days.

(21) Appl. No.: 11/135,297

(22) Filed: May 24, 2005

(65) Prior Publication Data

US 2005/0258532 A1 Nov. 24, 2005

(30) Foreign Application Priority Data

May 24, 2004 (JP) .............................. 2004-153086

(51) Int. Cl.
*G11C 5/02* (2006.01)
(52) U.S. Cl. ..................... 365/51; 365/63; 257/691
(58) Field of Classification Search ................ 365/233, 365/51, 63; 257/691, 773, 778, 784
See application file for complete search history.

(56) References Cited

U.S. PATENT DOCUMENTS

| | | | |
|---|---|---|---|
| 6,545,895 B1 * | 4/2003 | Li et al. .................... | 365/52 |
| 6,803,659 B1 * | 10/2004 | Suwa et al. ................ | 257/738 |
| 6,815,746 B1 * | 11/2004 | Suzuki et al. .............. | 257/296 |
| 6,967,368 B1 * | 11/2005 | Ozaki et al. ............... | 257/295 |
| 2005/0104175 A1 * | 5/2005 | Itano et al. ................ | 257/678 |
| 2006/0103004 A1 * | 5/2006 | Sakai et al. ............... | 257/700 |

FOREIGN PATENT DOCUMENTS

| | | |
|---|---|---|
| JP | 07-283340 | 10/1995 |
| JP | 11-097613 | 4/1999 |
| JP | 2003-036700 | 2/2003 |

* cited by examiner

*Primary Examiner*—Anh Phung
*Assistant Examiner*—Hien N Nguyen
(74) *Attorney, Agent, or Firm*—Antonelli, Terry, Stout and Kraus, LLP.

(57) ABSTRACT

A wiring board includes a plurality of wiring layers, and one surface formed with a plurality of chip connecting electrodes and another surface formed with a plurality of external connecting electrodes of a semiconductor device. The wiring board has wiring layers and vias. The plurality of chip connecting electrodes include first chip connecting electrodes, each used for a first signal whose logic value changes, and second chip connecting electrodes, each used for a second signal that changes after a change timing of the first signal. A wiring layer in which wiring routing of paths extending from the first chip connecting electrodes to their corresponding first external connecting electrodes is performed, and a wiring layer in which wiring routing of paths extending from the second chip connecting electrodes disposed adjacent to the first chip connecting electrodes to their corresponding second external connecting electrodes is performed, are made different from each other.

19 Claims, 20 Drawing Sheets

L2(VSS)

L3(VDD)

| L MATRIX | | | | | UNIT : nH |
|---|---|---|---|---|---|
| COMPARATIVE EXAMPLE | | CQ | DQ3 | DQ4 | DQ5 |
| | CQ | 3.1 | 0.43 | 0.27 | -0.01 |
| | DQ3 | – | 3.4 | 0.09 | -0.02 |
| | DQ4 | – | – | 2.9 | 0.12 |
| | DQ5 | – | – | – | 3.7 |
| EXAMPLE OF THE PRESENT INVENTION | | CQ | DQ3 | DQ4 | DQ5 |
| | CQ | 2.7 | 0.16 | 0.14 | 0.03 |
| | DQ3 | – | 3.4 | 0.15 | -0.01 |
| | DQ4 | – | – | 2.9 | 0.03 |
| | DQ5 | – | – | – | 3.7 |

| C MATRIX | | | | | UNIT : pF |
|---|---|---|---|---|---|
| COMPARATIVE EXAMPLE | | CQ | DQ3 | DQ4 | DQ5 |
| | CQ | 1.1 | 0.05 | 0.04 | 0.005 |
| | DQ3 | – | 1.1 | 0.01 | 0.001 |
| | DQ4 | – | – | 1.0 | 0.02 |
| | DQ5 | – | – | – | 1.1 |
| EXAMPLE OF THE PRESENT INVENTION | | CQ | DQ3 | DQ4 | DQ5 |
| | CQ | 1.0 | 0.01 | 0.03 | 0.001 |
| | DQ3 | – | 1.1 | 0.02 | 0.001 |
| | DQ4 | – | – | 1.1 | 0.02 |
| | DQ5 | – | – | – | 1.1 |

SEMICONDUCTOR DEVICE

CROSS-REFERENCE TO RELATED APPLICATION

The present application claims priority from Japanese patent application No. 2004-153086, filed on May 24, 2004, the content of which is hereby incorporated by reference into this application.

BACKGROUND OF THE INVENTION

The present invention relates in general to a semiconductor device having a CSP (Chip Size Package) configuration, or the like, wherein a semiconductor chip is mounted over a wiring board, and, more particularly, the invention relates to a technique for improving noise caused by a wiring routing arrangement provided over a wiring board, e.g., a technique that is effective when applied to a synchronous SRAM (Static Random Access Memory), or the like, that is memory-operated in a DDR (Double Data Rate) mode.

A clock synchronized memory, such as a synchronous SRAM, outputs a clock signal that is synchronized with a data output timing in order to indicate timing provided to determine read data to an access main body. Such a clock signal is called an "echo clock" with respect to an input clock signal that is used for a clock synchronous operation. In the synchronous SRAM, it is always outputted and operated regardless of read and write operations as a free running echo clock. The echo clock has been described in a patent document 1 (Japanese Unexamined Patent Publication No. 2003-36700).

A BGA or the like has been adopted for an LSI package to obtain a multi-pin configuration of an LSI and a reduction in chip size. A patent document 2 (Japanese Unexamined Patent Publication No. Hei 11(1999)-97613) has disclosed an LSI package technique wherein, in order to prevent the occurrence of noise due to crosstalk at the LSI package using BGA or the like, a signal group is divided into a signal group susceptible to noise, a signal group apt to emit noise, etc., and terminals are assigned to provide mutual separation.

A patent document 3 (Japanese Unexamined Patent Publication No. Hei 7(1995)-283340) has described a technique wherein, in a PGA (Pin Grid Array) package, ground pins surround a plurality of signal lines to perform isolation among signals.

SUMMARY OF THE INVENTION

The present inventors have discussed the problem of crosstalk in a signal in a wiring board that constitutes an LSI package for BGA or the like. It has been discovered by the present inventors that there is a concern that, in a synchronous SRAM, the free running echo clock is outputted and operated even during a write operation, and an undesired data error occurs due to a change in the clock causing crosstalk of input data. In brief, when wirings and vias provided over the wiring board contain undesired inductance components and capacitive components, and crosstalk noise is superimposed on write data due to inductive coupling or the like between a free running echo clock wiring and a write input data wiring, the logic value of the write data might be changed. However, it is difficult to completely separate a data input/output terminal of the synchronous SRAM and an output terminal for the free running echo clock by application of the technique described in the patent document 2. Such separation leads to a shift in timing or skew between signals. This is because, if a synchronous relationship, which exists between output data of plural bits and the free running echo clock, is not placed in a desired state, then the original object or aim that the timing provided to determine the read data is indicated to the access main body cannot be attained. Although it is also possible to surround the data input/output terminals and the free running echo clock output terminal by ground pins and perform isolation among the signals, as described in the patent document 3, this technique runs counter to miniaturization of the package.

Such crosstalk noise should be taken into consideration even with respect to a memory interface or memory controller for a synchronous DRAM, as well as for a synchronous SRAM. That is, the synchronous DRAM controller outputs a data strobe signal together with the output of write data. According to interface specs of the synchronous DRAM, however, the synchronous DRAM controller first changes the rising edge of the data strobe signal and thereafter outputs write data of plural bits. The data strobe signal is affected by power supply noise due to the plural-bit parallel output of the write data. In addition to the above, a data output terminal and an output terminal for the data strobe signal cannot be extremely separated from each other to minimize a shift in timing or skew between signals. Therefore, the data strobe signal is affected by crosstalk noise relative to the output data, particularly, by inductive coupling noise, in the same manner as described above. There is a concern that the level will be greatly reduced by the influences of both types of noise as a whole. There is a concern that, when the level of the data strobe signal becomes lower than the noise upon data output timing, the synchronous DRAM will perform a write operation before the write data is actually determined.

Also, the present inventors have discussed the problem of noise round-intrusion due to return currents in the wiring board that constitutes the LSI package for BGA or the like. That is, the present inventors have found that there is a concern that, when one ground via is caused to bear return currents in plural signal paths, the return currents corresponding to different signal states of plural signal pins are superimposed on the ground via, and they act in the direction to increase the mutual inductance of the signal paths, thereby promoting the inductive coupling noise.

An object of the present invention is to suppress crosstalk noise between signals held in a relationship in which one becomes a signal synchronized with the other.

Another object of the present invention is to suppress crosstalk noise between signals held in a relationship in which one becomes a signal synchronized with the other, in terms of a return current.

The above, other objects and novel features of the present invention will become apparent from the following description in the present specification and the accompanying drawings.

Representative aspects and features of the invention disclosed in the present application will be explained in brief as follows:

[1] There is provided a semiconductor device (1) wherein a semiconductor chip (3) is mounted over a wiring board (2). The wiring board includes a plurality of wiring layers (L1 through L4) and has one surface formed with a plurality of chip connecting electrodes (5) connected to a semiconductor chip, and the other surface is formed with a plurality of external connecting electrodes (6) of a semiconductor device. The wiring board has wirings formed in the wiring layers and vias that connect the wirings among the wiring layers to couple the chip connecting electrodes and external connecting electrodes associated with one another. The plurality of chip connecting electrodes include first chip connecting electrodes (P(DQ3), P(DQ4) and P(DQS)), each used in an interface for a first signal whose logic value changes in a predetermined timing, and second chip connecting electrodes (P(CQ) and P(DQd)), each used in an interface for a second signal having a timing at which a logic value thereof changes after the change timing of the first signal. A wiring layer (L1), in which wiring routing of paths extending from the first chip connecting electrodes to their corresponding first external connecting electrodes is principally performed, and a wiring layer (L4), in which wiring routing of paths extending from the second chip connecting electrodes disposed adjacent to the first chip connecting electrodes to their corresponding second external connecting electrodes is principally performed, are made different from each other. Owing to the difference between the wiring layers, a state in which wirings for the paths extending from the first chip connecting electrodes to their corresponding first external connecting electrodes, and wirings for the paths extending from the second chip connecting electrodes, disposed adjacent to the first chip connecting electrodes, to their corresponding second external connecting electrodes and are arranged in parallel within the same wiring layer, can be reduced to the utmost. Thus, it is possible to suppress or relax influence on the first signal by crosstalk noise caused due to a change in the second signal.

As a specific form of the present invention, the different wiring layers (L1 and L4) are respectively disposed on the surface side of the wiring board and the back surface side thereof, with a wiring layer (L3) having a power supply plane and a wiring layer (L2) having a ground plane being interposed therebetween.

The elimination of overlapping of wirings among the wiring layers will be taken into consideration in the specific form of the present invention. That is, a ground plane and a power supply plane disposed between the wiring layers function as barrier layers for inductance components. In fact, however, lots of vias for connecting the obverse and reverse wiring layers extend through the barrier layers, and the magnetic flux produced due to the inductance components passes though the through holes. Therefore, a layout intersecting between the wiring layers is adopted for wirings for the paths extending from the first chip connecting electrodes to their corresponding first external connecting electrodes in one wiring layer, and wirings for the paths extending from the second chip connecting electrodes disposed adjacent to the first chip connecting electrodes to their corresponding second external connecting electrodes in the other wiring layer. Owing to the intersecting layout, a section in which the wiring layers are arranged in parallel is reduced even between the wiring layers. Thus, coupling noise produced due to the influence of leakage flux from the barrier layers can also be suppressed.

In a further specific form of the present invention, influence due to return currents will be considered. That is, vias (TH(VSS)) each connected to the ground plane are respectively individually provided adjacent to vias (TH(DQ3) and TH(DQ4)) for the paths extending from the first chip connecting electrodes to their corresponding first external connecting electrodes and vias (TH(CQ)) for the paths extending from the second chip connecting electrodes disposed adjacent to the first chip connecting electrodes to their corresponding second external connecting electrodes. Since individual ground vias adjacent to the respective vias at paths for predetermined first and second signals are caused to bear the return currents, return currents corresponding to signal states of other signal paths are hard to overlap with the individual ground vias. This acts in the direction to reduce the mutual inductances of the respective signal paths and acts so as to suppress the inductive coupling noise.

In a specific form according to another aspect of the present invention, the first signal is input data, and the second signal is an output clock. At this time, the output clock is a free running echo clock, and the semiconductor chip is a synchronous SRAM.

In another specific form, the first signal is an output clock, and the second signal is output data. At this time, the output clock is a data strobe signal, and the semiconductor chip is a data processor having a synchronous DRAM interface.

In a further specific form of the present invention, a terminal array of a semiconductor chip will be taken into consideration. That is, the semiconductor chip has a plurality of bump electrodes respectively connected to the plurality of chip connecting electrodes, and second bump electrodes (CQ) corresponding to the second chip connecting electrodes are located at an end of an array of first bump electrodes (DQ) corresponding to the first chip connecting electrodes. The influence of crosstalk due to relocating wirings or the like from bump electrodes of the semiconductor chip or pad electrodes provided over the chip to their corresponding bump electrodes can also be relaxed or suppressed.

[2] There is a semiconductor device according to another aspect of the present invention, wherein a semiconductor chip is mounted over a wiring board. The wiring board has a plurality of wiring layers and has one surface formed with a plurality of chip connecting electrodes connected to the semiconductor chip and the other surface formed with a plurality of external connecting electrodes of the semiconductor device. The plurality of chip connecting electrodes include first chip connecting electrodes, each used in an interface for a first signal whose logic value changes in a predetermined timing, and second chip connecting electrodes each used in an interface for a second signal having a timing at which a logic value thereof changes after the change timing of the first signal. Of wirings for paths extending from the first chip connecting electrodes to their corresponding first external connecting electrodes and wirings for paths extending from the second chip connecting electrodes to their corresponding second external connecting electrodes, the wirings having sections arranged in parallel adjacent to one another are provided such that the sections thereof provided in the wiring layers different from one another become longer than the sections thereof arranged in parallel to one another within the same wiring layer. Reducing the wiring sections that are arranged in parallel to one another within the same wiring layer makes it possible to reduce, to the utmost, a state in which the wirings for the paths extending from the first chip connecting electrodes to their corresponding first external connecting electrodes, and the wirings for the paths extending from the second chip connecting electrodes disposed adjacent to the first chip connecting electrodes to their corresponding second external connecting electrodes are arranged in parallel within the same wiring layer. Thus, it is possible to suppress or relax influence on the first signal by crosstalk noise caused due to a change in the second signal.

In a specific form of the present invention, the first signal is input data, and the second signal is an output clock. At this time, the output clock is a free running echo clock, and the semiconductor chip is a synchronous SRAM. In another specific form, the first signal is an output clock, and the second signal is output data. At this time, the output clock is a data strobe signal, and the semiconductor chip is a data processor having a synchronous DRAM interface.

[3] In accordance with the invention, which is mainly concerned with the influence due to return currents, there is provided a semiconductor device wherein a semiconductor chip is mounted over a wiring board. The wiring board has a plurality of wiring layers and has one surface formed with a plurality of chip connecting electrodes connected to the semiconductor chip and the other surface formed with a plurality of external connecting electrodes of the semiconductor device. The wiring board includes wirings formed in the wiring layers and vias that connect the wirings, among the wiring layers, to connect the chip connecting electrodes and external connecting electrodes associated with one another. The plurality of chip connecting electrodes include first chip connecting electrodes each used in an interface for a first signal whose logic value changes with a predetermined timing, and second chip connecting electrodes, each used in an interface for a second signal having a timing at which the logic value thereof changes after the change timing of the first signal. Vias, each connected to the ground plane, are respectively individually disposed adjacent to vias for paths extending from the first chip connecting electrodes to their corresponding first external connecting electrodes and adjacent to vias for paths extending from the second chip connecting electrodes, disposed adjacent to the first chip connecting electrodes, to their corresponding second external connecting electrodes. Since individual ground vias disposed adjacent to the respective vias at paths for predetermined first and second signals are caused to bear the return currents, the return currents corresponding to signal states of other signal paths are hard to overlap with the individual ground vias. This acts in the direction to reduce the mutual inductances of the respective signal paths and acts to suppress the inductive coupling noise.

In a specific form of the present invention, the first signal is input data, and the second signal is an output clock. The output clock is a free running echo clock, and the semiconductor chip is a synchronous SRAM. In another specific form, the first signal is an output clock, and the second signal is output data. The output clock is a data strobe signal, and the semiconductor chip is a data processor having a synchronous DRAM interface.

Advantageous effects obtained by the invention disclosed in the present application will be explained in brief as follows:

It is possible to suppress crosstalk noise developed between two signals which are held in a relationship in which one signal becomes synchronized with the other signal. Further, crosstalk noise produced between two signals, which are held in a relationship in which one signal becomes synchronized with the other signal, can be suppressed from the viewpoint of a return current.

DETAILED DESCRIPTION OF THE PREFFERED EMBODIMENTS

<<Semiconductor Device>>

Figure 1:
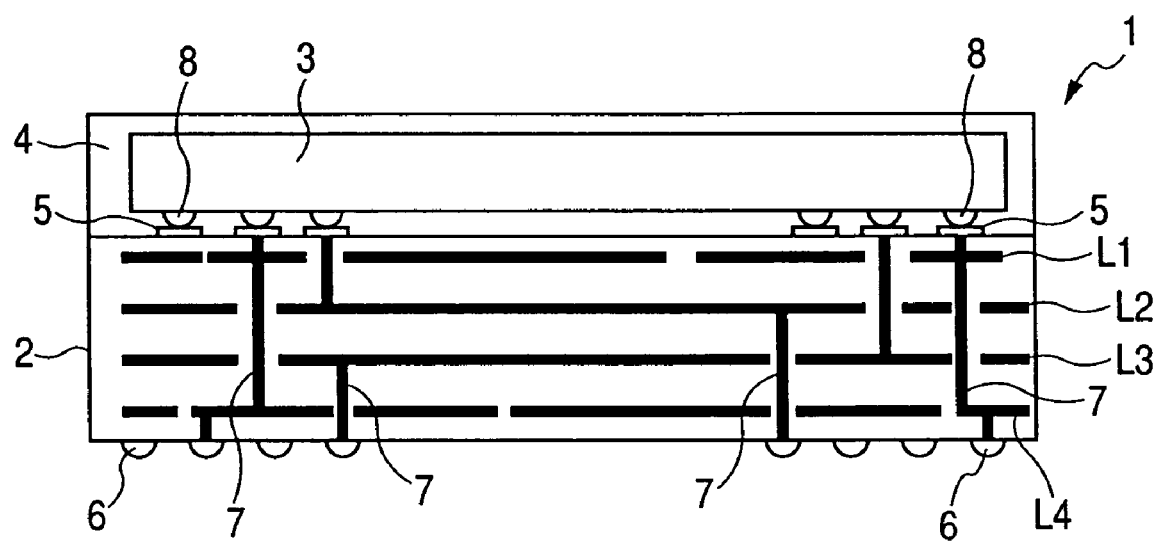
FIG. 1 is a cross-sectional view diagrammatically illustrating a semiconductor device according to the present invention.

A cross-sectional view of a semiconductor device according to the present invention is illustrated in FIG. 1. The semiconductor device 1 has a CSP configuration in which a semiconductor chip 3 is mounted over a wiring board (called a "package substrate") 2. The surface of the semiconductor chip 3 is molded with a resin 4. The package substrate 2 has one surface formed with a plurality of chip connecting electrodes connected to the semiconductor chip 3, e.g., pad electrodes 5, and the other surface is formed with a plurality of external connecting electrodes, e.g., solder ball electrodes 6. In the figure, the package substrate 2 is configured as a ceramic substrate having wiring layers L1 through L4 corresponding to four layers. In order to connect the pad electrodes 5 to their corresponding solder ball electrodes 6, the package substrate 2 has required wirings formed in the wiring layers L1 through L4, and vias 7 that connect wirings among the wiring layers L1 through L4. The wiring layer L2 is substantially configured as a ground plane, and the wiring layer L3 is substantially configured as a power supply plane. Each of the vias 7 is generically known or designated as a conductive portion formed by giving an inner surface of a via hole or a through hole conductive plating. The semiconductor chip 3 has a plurality of bump electrodes 8 connected to corresponding pad electrodes 5.

Figure 2:
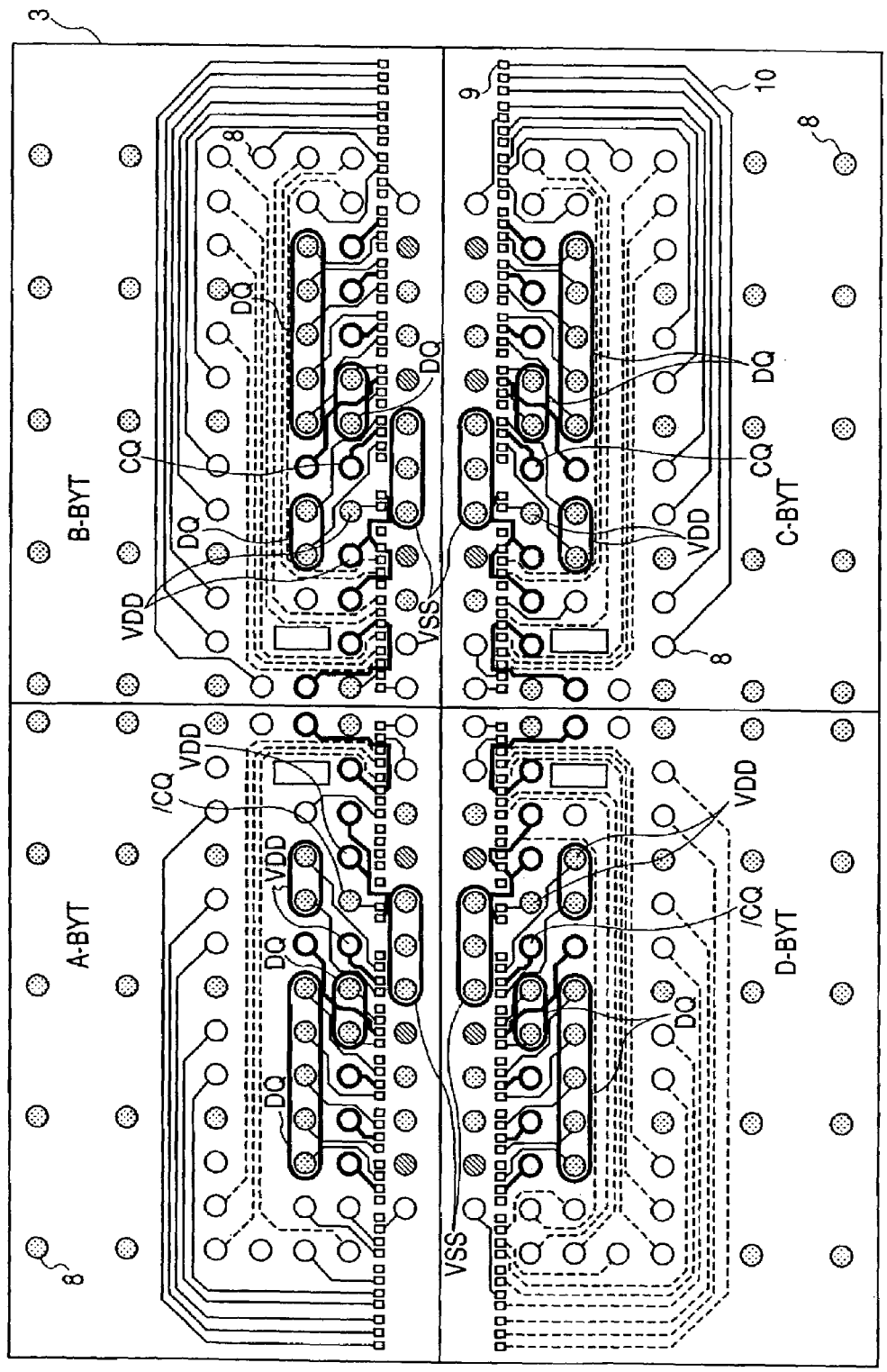
FIG. 2 is a plan view illustrating an array of bump electrodes of a semiconductor chip.

One example of the semiconductor chip 3 is shown in FIG. 2. The semiconductor chip 3 shown in FIG. 2 is in the form of a synchronous SRAM and is accessible in a DDR configuration. The semiconductor chip 3 comprises four memory blocks of A-BYT, B-BYT, C-BYT and D-BYT. The memory blocks have constitutions identical to one another and include, as bump electrodes common to the respective memory blocks, a power supply terminal, a ground terminal, an address input terminal, a synchronous access control terminal and a system clock input terminal, etc. Further, the semiconductor chip 3 is individualized in every one of the memory blocks. Each memory block includes bump electrodes corresponding to data input/output terminals DQ of 9 bits and an echo clock output terminal CQ (/CQ) of 1 bit, etc. An echo clock is outputted from each of the output terminals CQ and /CQ at free running. The memory blocks B-BYT and C-BYT output the echo clock CQ and the memory blocks A-BYT and D-BYT output the echo clock /CQ. The echo clock /CQ is defined as an inverted clock of the echo clock CQ. In FIG. 2, the bump electrodes 8 are regularly dispersed and disposed over the surface of the semiconductor chip 3 at relatively large intervals, and they are marked with circular symbols.

The semiconductor chip 3 has bump electrodes 8 to be connected in a so-called flip-chip form. Relocating wirings 10 are led out onto a protective film from bonding pads (marked with small square symbols) 9 disposed in the center of the chip in two rows. The bonding pads are connected to their corresponding bump electrodes 8 through the relocating wirings 10.

Figure 3:
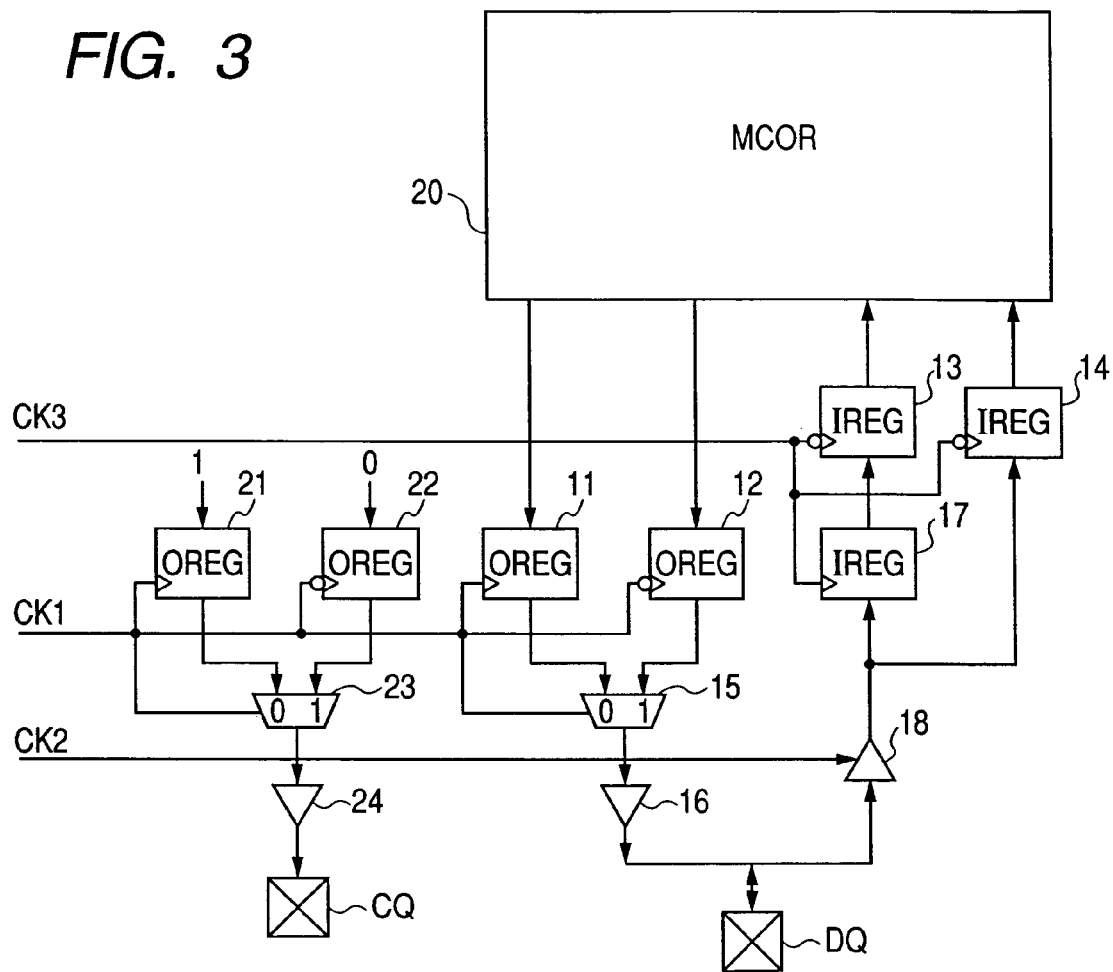
FIG. 3 is a block diagram schematically illustrating configurations related to a data input/output terminal and an echo clock output terminal of one memory block employed in the semiconductor chip.

Configurations according to a data input/output terminal DQ and an echo clock output terminal CQ of one memory block are schematically shown in FIG. 3. One data input/output terminal DQ is typically shown in the figure. A memory core (MCOR) 20 has arrays of static memory cells and selection circuits for the memory cells in the form of two banks. The two banks are parallel-operated in sync with a system clock. Data read for every one of the banks is parallel-latched in output registers (OREG) 11 and 12, and write data is supplied from input registers (IREG) 13 and 14 to the respective banks in parallel. CK1 through CK3 indicate internal clocks synchronized with the system clock. The output registers 11 and 12 are output-operated for each half cycle of the clock CK1. Their outputs are alternately selected by a selector 15 whose inputs are similarly switched for each half cycle of the clock CK1. The selected output is outputted from the data input/output terminal DQ through an output buffer 16. An output enable signal for the output buffer 16 is not shown.

Each of the input registers 13 and 14 performs a latch operation in sync with a negative phase cycle of the internal clock CK3. An input register 17, which performs a latch operation in sync with a positive phase cycle, is disposed in a stage prior to the input register 13. Write data supplied to the data input/output terminal DQ for each half cycle of the system clock is supplied from the input registers 13 and 14 to the respective memory banks through an input buffer 18 for each negative phase cycle of the clock CK3. CK2 indicates an enable clock for the input buffer 18.

An output register 21 for retaining "1" and an output register 22 for retaining "0" are used for the output of a free running echo clock. One output register 21 is output-operated in a positive phase cycle of the clock CK1. The other output register 22 is output-operated in a negative phase cycle of the clock CK1. The outputs of both output registers are similarly alternately selected by a selector 23 whose inputs are switched for each half cycle of the clock CK1. The selected output is outputted from the echo clock output terminal CQ through an output buffer 24. The echo clock is outputted at free running and is outputted without a distinction between write and read operations. An output of read data or an input of write data can be generated for two cycles in one cycle of the echo clock.

Figure 4:
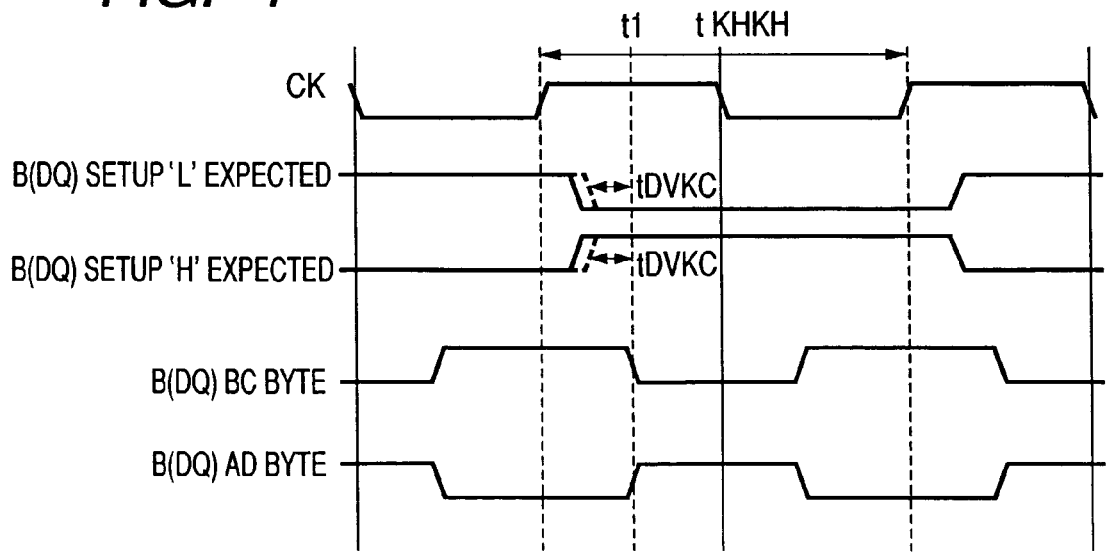
FIG. 4 is a waveform diagram illustrating an echo clock and output data.

Waveforms of an echo clock and output data are illustrated in FIG. 4. The echo clocks outputted from the terminals CQ and /CQ originally have the meaning that timings provided to determine read data outputted from the corresponding data input/output terminal DQ are indicated by a rising edge and a falling edge, respectively. In FIG. 4, times or time intervals tDVKC result in times required to set up data outputs with respect to CQ and /CQ switching timings at a time t1.

<<Consideration of Crosstalk>>

A reduction in crosstalk noise produced over the package substrate will be explained. An examination of the process, until the cause of generation of crosstalk noise, to which attention should be paid, becomes apparent, will first be described.

Referring to FIG. 4, when a data input timing outputted from the terminal DQ is caused to gradually approach each of the switching timings of the terminal CQ and /CQ with respect to input data of a low level ("0" or "L") of an external terminal B (DQ) over the package substrate, corresponding to the terminal DQ and input data of a high level ("1" or "H") thereof, the minimum setup time (tDVKC) at which the logic value of the input data is not brought to an error, was measured. The margin becomes large as the setup time (tDVKC) becomes small, whereas, as the setup time (tDVKC) becomes large, the margin becomes small.

Figure 5:
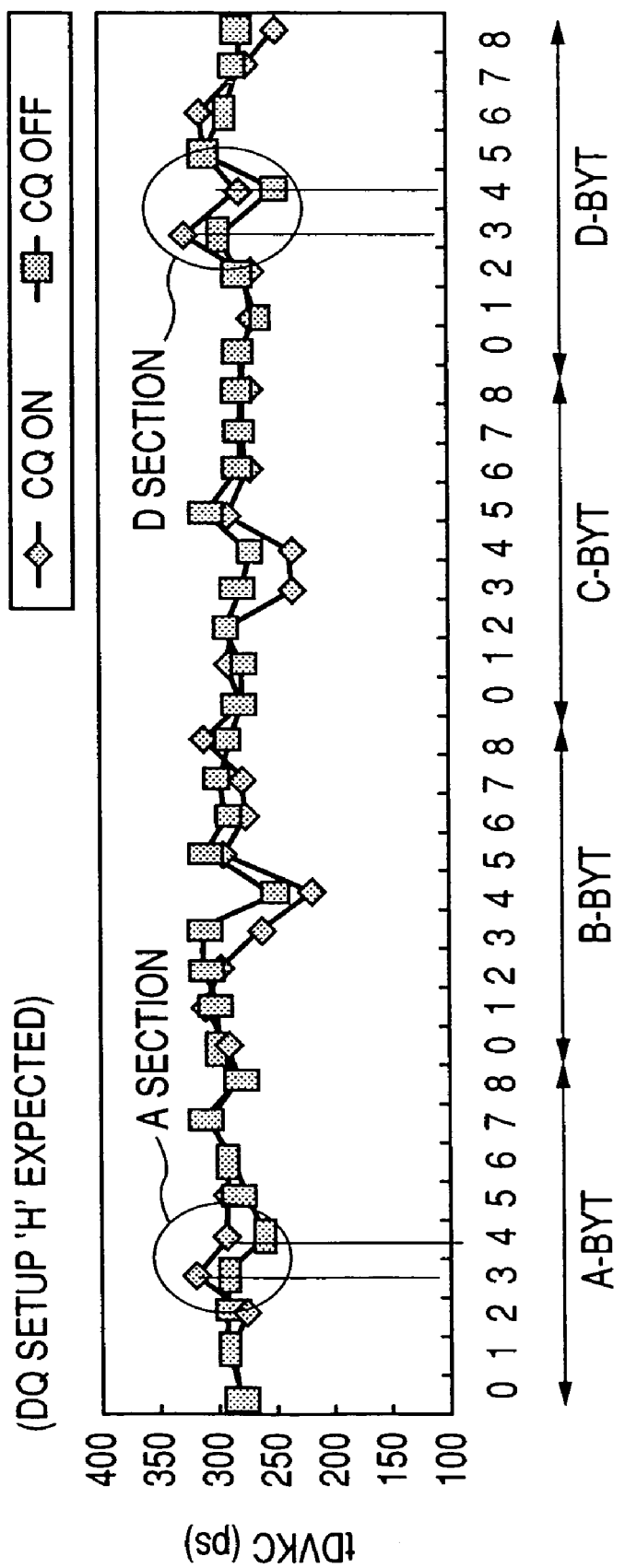
FIG. 5 is a graphical diagram illustrating a result of measurement of a setup time (tDVKC) at the time that a high level data output is set as an expected value.
Figure 6:
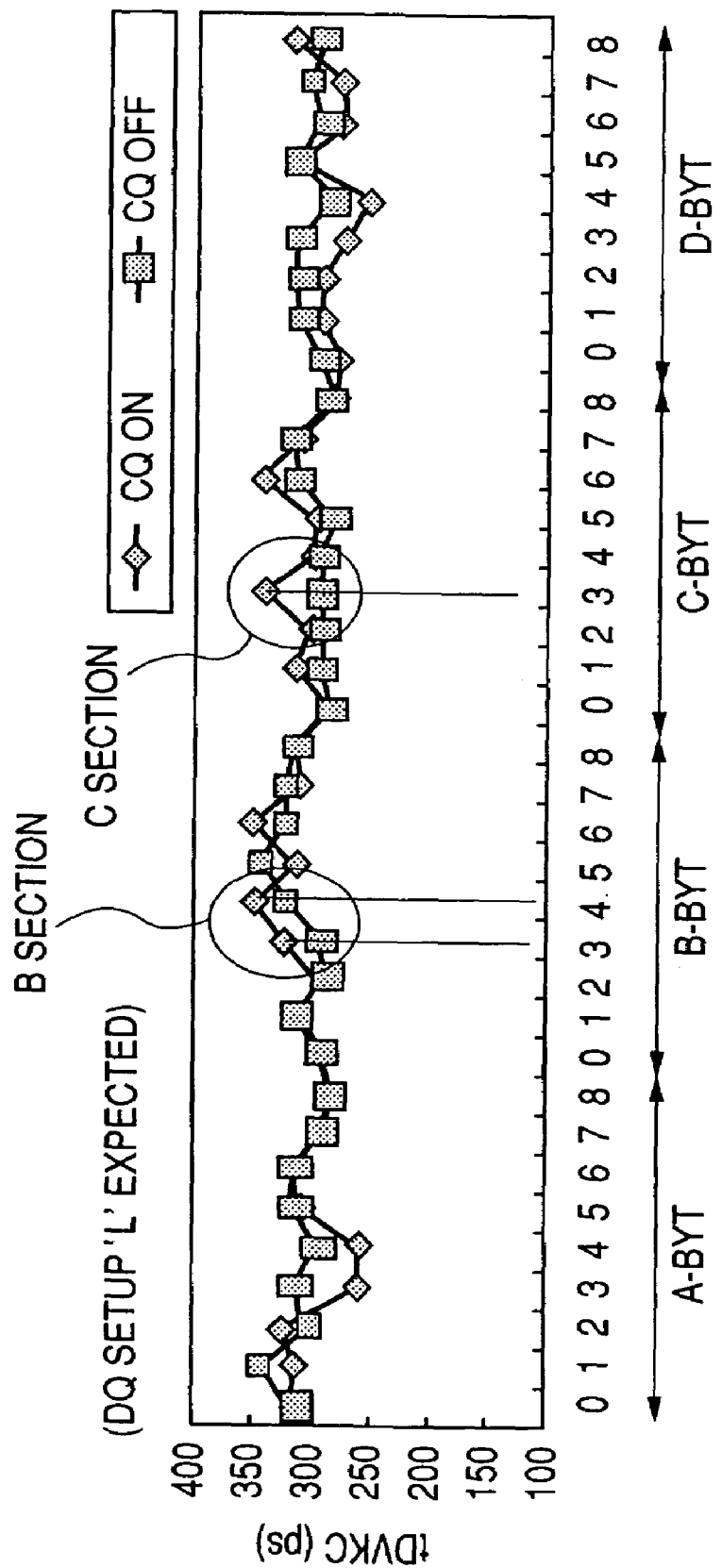
FIG. 6 is a graphical diagram illustrating a result of measurement of a setup time (tDVKC) at the time that a low level data output is set as an expected value.

FIG. 5 shows a result of measurement of the setup time (tDVKC) at the time that a high level data input is defined as an expected value. FIG. 6 shows a result of measurement of the setup time (tDVKC) at the time that a low level data input is defined as an expected value. In the respective figures, the vertical axis indicates the minimum setup time (tDVKC), and the horizontal axis indicates terminal positions set for every one of the memory blocks A-BYT to D-BYT. The terminal positions i (where i=0 to 8) means DQi. Two types of measurements on the setup time, corresponding to a case in which the output of CQ is set to on and a case in which it is set to off, were carried out. It is understood from the result of such measurements that since the margin becomes small as the setup time (tDVKC) increases, margins for a section A of A-BYT and a section D of D-BYT are small in particular in FIG. 5. It is understood that margins for a section B of B-BYT and a section C of C-BYT are small in particular in FIG. 6. The sections A through D are respectively close to terminals DQ3 and DQ4. The terminal CQ is disposed near the terminals DQ3 and DQ4. With on/off of the output of the terminal CQ, there are differences in setup time (tDVKC) among the sections A through D. Thus, the cause of low margins at the sections A through D is considered to be crosstalk related to the echo clock outputted from the terminal CQ. Further, the sections A and D become low in margin upon expectation of the input of "H" in FIG. 5, whereas the sections B and C become low in margin upon expectation of the input of "L" in FIG. 6. However, this is common under the condition that the direction of a change in signal from the terminal CQ and the direction of a change in signal to the terminal DQ become the same direction. In brief, the sections A and D result in setup times provided for the rising edge of the signal at the terminal DQ with respect to a rise timing of the echo clock from the terminal /CQ. The sections B and C result in setup times for the falling edge of the signal at the terminal DQ with respect to a fall in timing of the echo clock from the terminal CQ. Crosstalk noise coincides with the property that it becomes large where it is based on a change in signal in the same direction.

Thus, it is understood that there is a strong concern that a data terminal adjacent to a clock terminal will be subjected to crosstalk noise through the clock terminal, to thereby cause deterioration in the timing margin.

Figure 7:
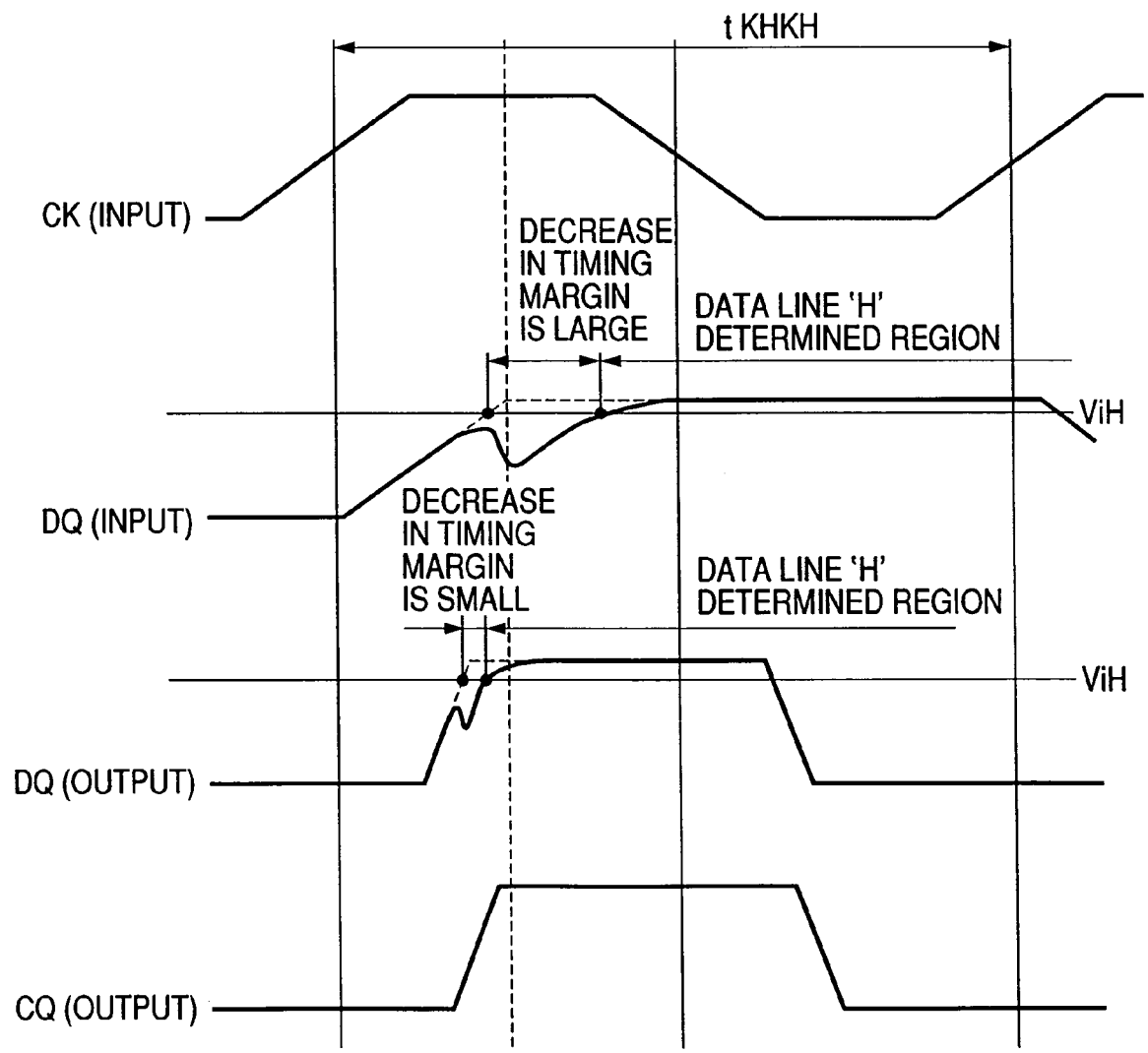
FIG. 7 is a waveform diagram for illustrating, in further detail, influences caused due to crosstalk noise, which are exerted on input data and output data.

In FIG. 7, influences caused by such crosstalk noise are considered in further detail with respect to the respective input and output data. When the echo clock outputted from the terminal CQ changes from a low level to a high level as shown in FIG. 7, noise whose voltage is directed to the negative, occurs in a wiring for a terminal DQ located on the periphery of the terminal CQ. In brief, inductive coupling noise rather than capacitive coupling noise occurs in excess. When, at this time, a switching timing provided for a signal at the terminal DQ is close to a switching timing provided for the echo clock at the terminal CQ, the potential of the signal at the terminal DQ is reduced due to the influence of crosstalk noise caused due to the echo clock of the terminal CQ. Therefore, it is considered that the timing margin is reduced and the determination of a high level of the signal at the terminal DQ is delayed.

Particularly, when the signal is inputted to the terminal DQ, the time (Tr) required to raise the input signal of the terminal DQ is long as compared with that which occurs upon its output. Correspondingly, the signal is susceptible to noise and the amount of a reduction in timing margin becomes larger. This is because the input data is easy to become dull in waveform change due to a wiring load, a parasitic capacitive component, etc.

It is apparent even from the results shown in FIGS. 5 and 6, that as the wiring interval becomes short, the crosstalk noise increases, and the crosstalk noise with respect to the signals of the terminals DQ3 and DQ4 adjacent to the terminal CQ becomes large as compared with signals at other terminals DQ.

<<Countermeasures Against Crosstalk Noise in a Synchronous SRAM>>

Figure 8:
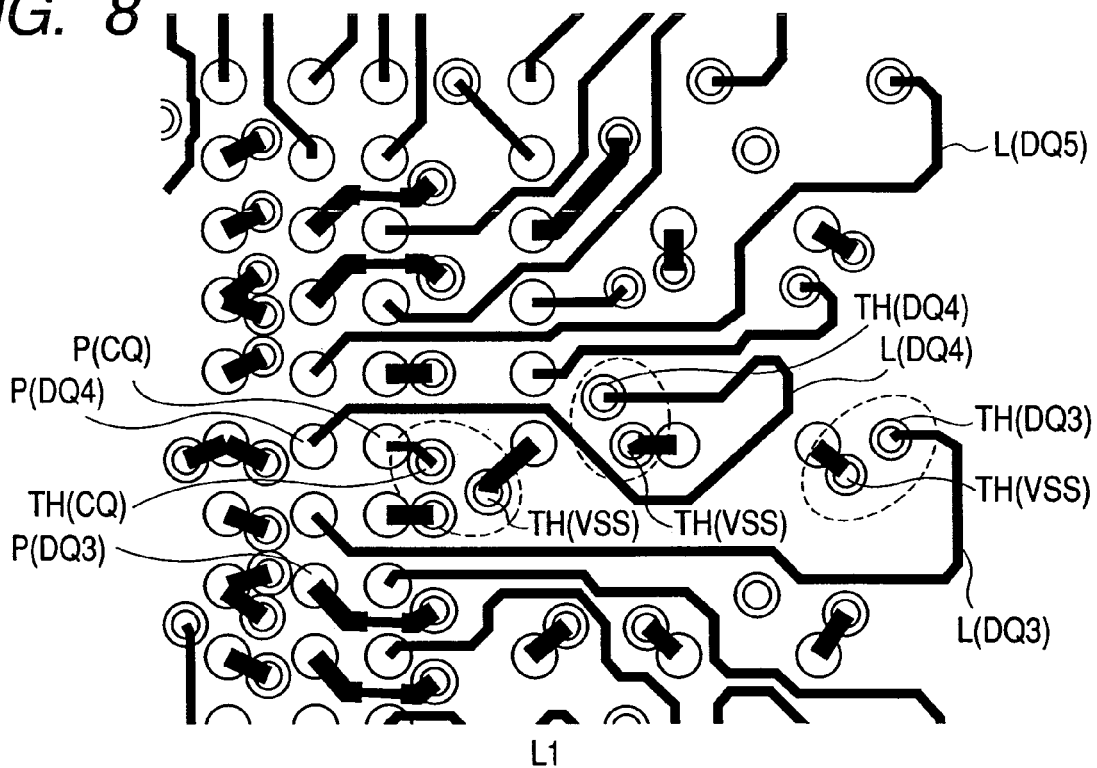
FIG. 8 is a wiring pattern diagram showing a first wiring layer L1 in the neighborhood of P(CQ), P(DQ3) and P(DQ4) employed in a package substrate.
Figure 9:
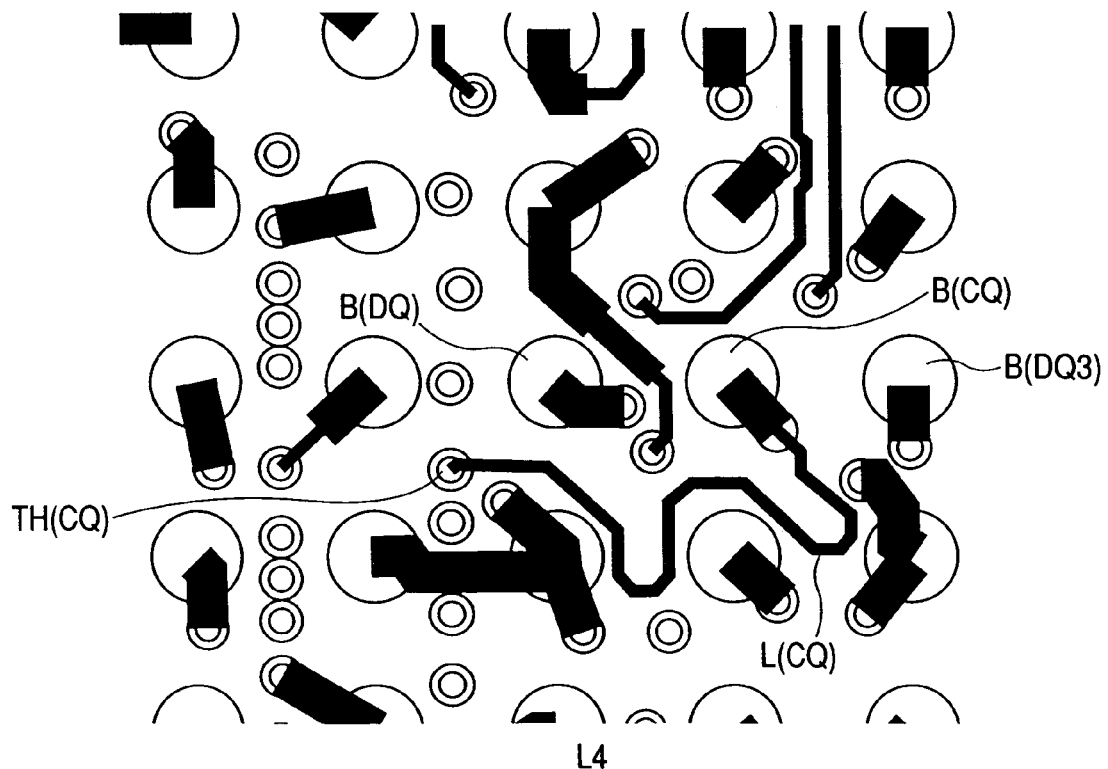
FIG. 9 is a wiring pattern diagram depicting part of a fourth wiring layer L4 located below the first wiring layer L1 of FIG. 8.
Figure 10:
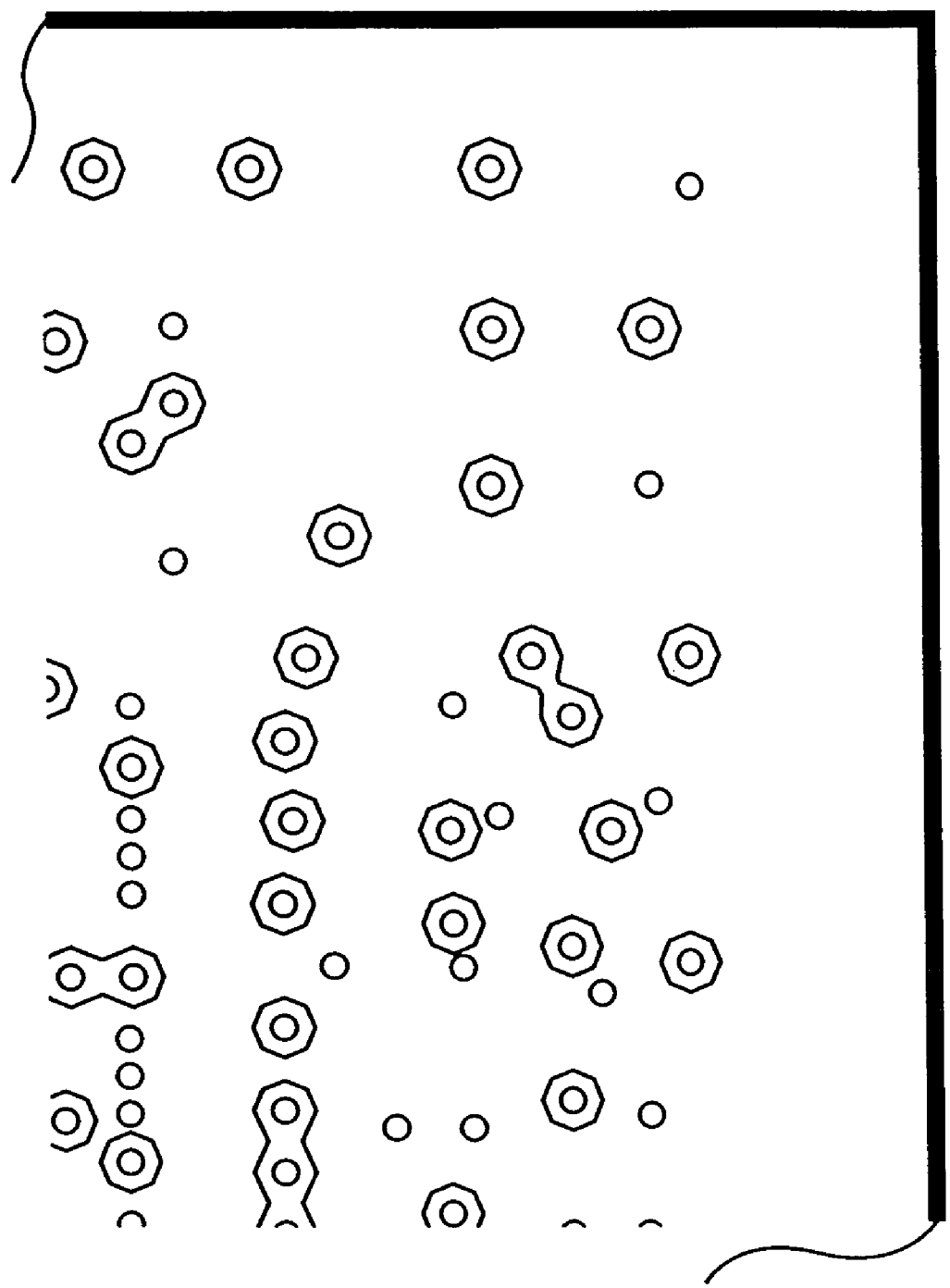
FIG. 10 is a pattern diagram showing the arrangement of a ground plane of a second wiring layer L2 through which lots of vias extend.
Figure 11:
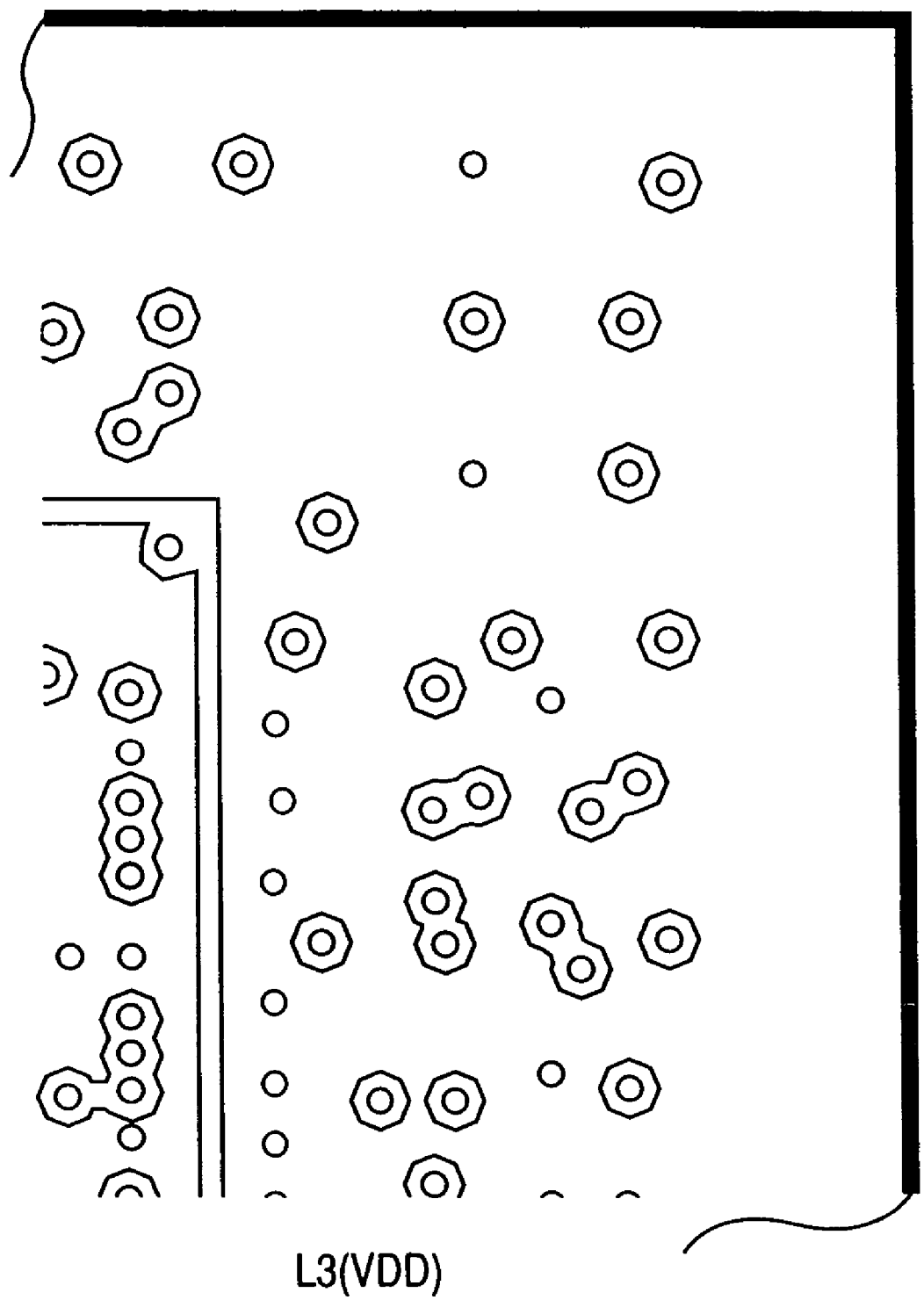
FIG. 11 is a pattern diagram showing the arrangement of a power supply plane of a third wiring layer L3 through which lots of via extend.

Firstly, the wirings for DQ3 and DQ4, which are adjacent to CQ, are placed so as not to be arranged in a line within the same wiring layer, to the utmost extent. FIG. 8 shows a first wiring layer L1 adjacent to CQ, DQ3 and DQ4, and FIG. 9 shows part of a fourth wiring layer L4 directly below the first wiring layer L of FIG. 8. FIG. 10 shows the arrangement of a ground plane of a second wiring layer L2 through which lots of vias extend, and FIG. 11 shows the arrangement of a power supply plane of a third wiring layer L3 through which lots of vias extend. In the figures, P(m) indicates electrode pads connected to corresponding terminals, TH(m) indicates vias connected to corresponding terminals m, L(m) indicates wirings connected to their corresponding terminals m, and B(m) indicates solder ball electrodes connected to corresponding terminals m.

In FIG. 8, P(CQ), P(DQ3) and P(DQ4) are adjacent to one another. Of these, P(CQ) extends through the ground plane and the power supply plane through a via TH(CQ) located in the immediate vicinity thereof. Then, P(CQ) is connected to a wiring L(CQ) of the fourth wiring layer L4 of FIG. 9 so as to conduct into its corresponding solder ball electrode B(CQ). On the other hand, P(DQ3) and P(DQ4) are routed to over their corresponding solder ball electrodes through wires L(DQ3) and L(DQ4) lying over the first wiring layer L1. At those spots, P(DQ3) and P(DQ4) extend through the ground plane and the power supply plane through vias TH(DQ3) and TH(DQ4) after which they are made conductive to their corresponding solder ball electrodes B(DQ3) and B(DQ4) of the fourth wiring layer L4 of FIG. 9.

Thus, the wiring layer L4, in which the wiring routing of a path extending from P(CQ) to its corresponding B(CQ) is principally carried out, is made different from the wiring layer L1, in which the wiring routing of paths extending from P(DQ3) and P(DQ4) disposed adjacent to P(CQ) to their corresponding B(DQ3) and B(DQ4) are principally carried out. Consequently, a state in which the wirings are arranged in parallel in the same wiring layer as in the case of L(CQ), L(DQ3) and L(DQ4), can be reduced to the utmost extent. The wiring layers in which the wiring routing is principally carried out, i.e., the wirings that connect between P(CQ) and B(CQ), are constituted of wirings formed in the respective wiring layers L1 through L4. Of these wiring layers L1 through L4, however, the wiring layer whose wiring rate occupied in the wiring path extending from P(CQ) to B(CQ) is the largest, i.e., the wiring layer constituting the longest wiring of the wirings extending from P(CQ) to B(CQ), corresponds to the L4 layer. Accordingly, the wiring layer in which the wiring routing of the path extending from P(CQ) to B(CQ) is principally carried out, is regarded as the L4 layer. Compared with the above, a wiring layer whose wiring rate occupied in the wiring path extending from P(DQ3) to B(DQ3) is the largest, i.e., a wiring layer constituting the longest wiring of the wirings extending from P(DQ3) to B(DQ3), corresponds to the L1 layer. Accordingly, the wiring layer, in which the wiring routing of the path extending from P(DQ3) to B(DQ3) is principally carried out, results in the L1 layer.

Further, the power supply plane and the ground plane are interposed between the fourth wiring layer in which L(CQ) is disposed, and the first wiring layer in which L(DQ3) and L(DQ4) are disposed. They function as shield layers. Thus, it is possible to suppress or relax the influence on input data of the terminals DQ3 and DQ4 by crosstalk noise caused due to a change in the echo clock at the terminal CQ.

Secondly, the influence caused by a return current will be taken into consideration. That is, vias TH(VSS) connected to the ground plane are respectively individually disposed adjacent to the vias TH(CQ), TH(DQ3) and TH(DQ4) in the signal path before crosstalk is suppressed. Thus, the individual ground vias TH(VSS) adjacent to the vias TH(CQ), TH(DQ3) and TH(DQ4) bear the return current. Therefore, a return current corresponding to a signal state of the other signal path is hard to overlap with the individual ground vias TH(VSS). This acts in the direction to reduce the mutual inductances of signal paths related to CQ, DQ3 and DQ4 and acts so as to suppress the inductive coupling noise. There is a significant concern that, when one via TH(VSS) is shared among the vias TH(CQ), TH(DQ3) and TH(DQ4), noise will be round-intruded into another signal through the return current.

Thirdly, the elimination of overlapping wirings among the wiring layers will be taken into consideration. That is, the ground plane of the first wiring layer L1 disposed between the wiring layers, and the power supply plane of the third wiring layer L3 function as shield layers for magnetic flux produced due to inductance components. In fact, however, lots of vias for connecting the obverse and reverse wiring layers L1 and L4 extend through the L2 and L3 layers, and the magnetic flux produced due to the inductance components passes through the through holes. Thus, it is desirable that a layout intersecting between the wiring layers is adopted for the wiring L(CQ) in the first wiring layer L1 and the wirings L(DQ3) and L(DQ4) in the fourth wiring layer L4. Although the wiring L(CQ) and the wiring L(DQ4) is arranged so as to overlap in the obverse/reverse direction in the examples shown in FIGS. 8 and 9, L(CQ) is bent where possible and a section, in which the wiring L(CQ) and L(DQ4) are arranged in parallel, is reduced even between the wiring layers. Thus, coupling noise produced due to the influence of leakage flux from the shield layer can also be suppressed. If only a reduction in coupling noise is desired, it will be effective to completely locate the wiring connected to the data input/output terminal DQ away from above the wiring L(CQ). However, when such a structure is adopted, it becomes difficult to maintain equality in the lengths of a data input/output wiring L(DQ) and an echo clock wiring L(CQ). Hence, a satisfactory timing margin cannot be obtained. Consequentially, even if the wiring layer L4 in which the routing of the wiring L(CQ) is mainly carried out, and the wiring layer L1 in which the routing of the wiring L(DQ4) is mainly carried out, are made different as described above, it becomes very difficult to design them in such a manner that their wirings L(DQ3) and L(DQ4) are not disposed directly above the wiring L(CQ) or in the neighborhood thereof. It has been found from such findings that, if the wiring L(CQ) is not located sufficiently for away from being directly below L(DQ3) and L(DQ4), it is then effective to allow the wiring L(CQ) to pass through the neighborhood of the plural wirings of the wirings connected to the data input/output terminals DQ in order to disperse the influence of the coupling noise exerted on these wirings. In particular, a wiring layout is determined in such a manner that the number of data input/output wirings with respect to which the wiring L(CQ) is adjacent, becomes three or more. Consequently, the influence of the coupling noise is dispersed into the respective data input/output wirings. It is more preferable to do so.

Figure 12:
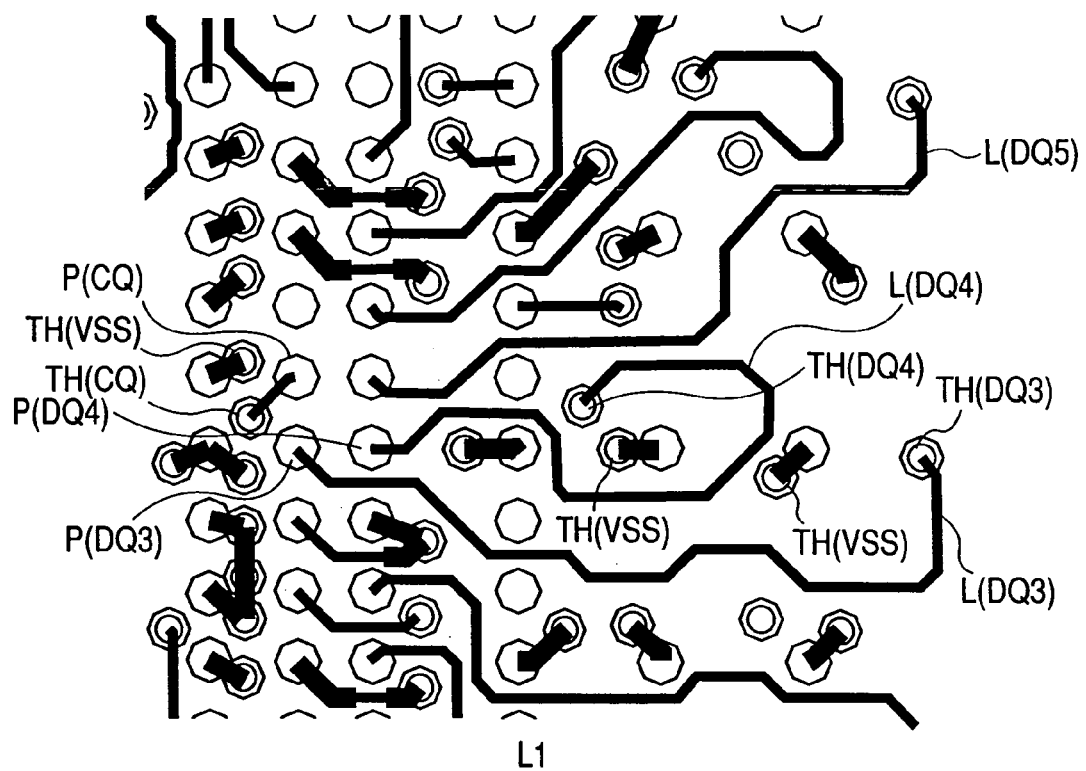
FIG. 12 is a wiring pattern diagram depicting the first wiring layer L1 in the neighborhood of P(CQ), P(DQ3) and P(DQ4) employed in the package substrate at the time that the elimination of overlapping of wirings between the wiring layers is enforced.
Figure 13:
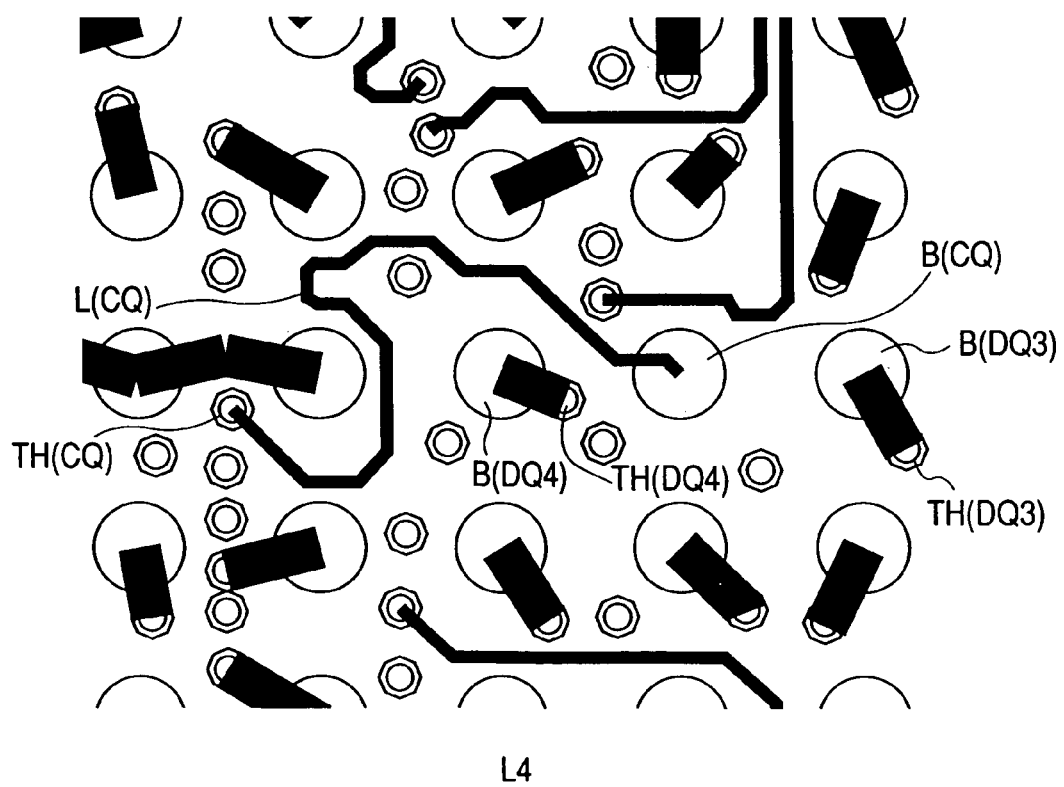
FIG. 13 is a wiring pattern diagram showing part of the fourth wiring layer L4 corresponding to FIG. 12.

An example in which the elimination of overlapping wirings between the wiring layers has been enforced, which is indicative of the third aspect, is shown in each of FIGS. 12 and 13. As to a wiring L(CQ), a path which substantially bypasses a directly-above wiring L(DQ4) in an intersecting direction in FIG. 13, as compared with FIG. 9, is set. By allowing L(CQ) to approach data input/output wirings L(DQ3), L(DQ4) and L(DQ5), the influence of coupling noise exerted from L(CQ) can be dispersed into the wirings L(DQ3), L(DQ4) and L(DQ5), and the influence of the coupling noise at the respective wirings can be suppressed to a sufficiently low value. Thus, a configuration in which the wiring L(CQ) that leads to a noise source is disposed adjacent to the wirings L(DQ3), L(DQ4) and L(DQ5) corresponding to three or more, can easily be achieved by allowing the wirings layers for the wiring L(CQ) and the wirings L(DQ3), L(DQ4) and L(DQ5) to differ from one another.

Figure 14:
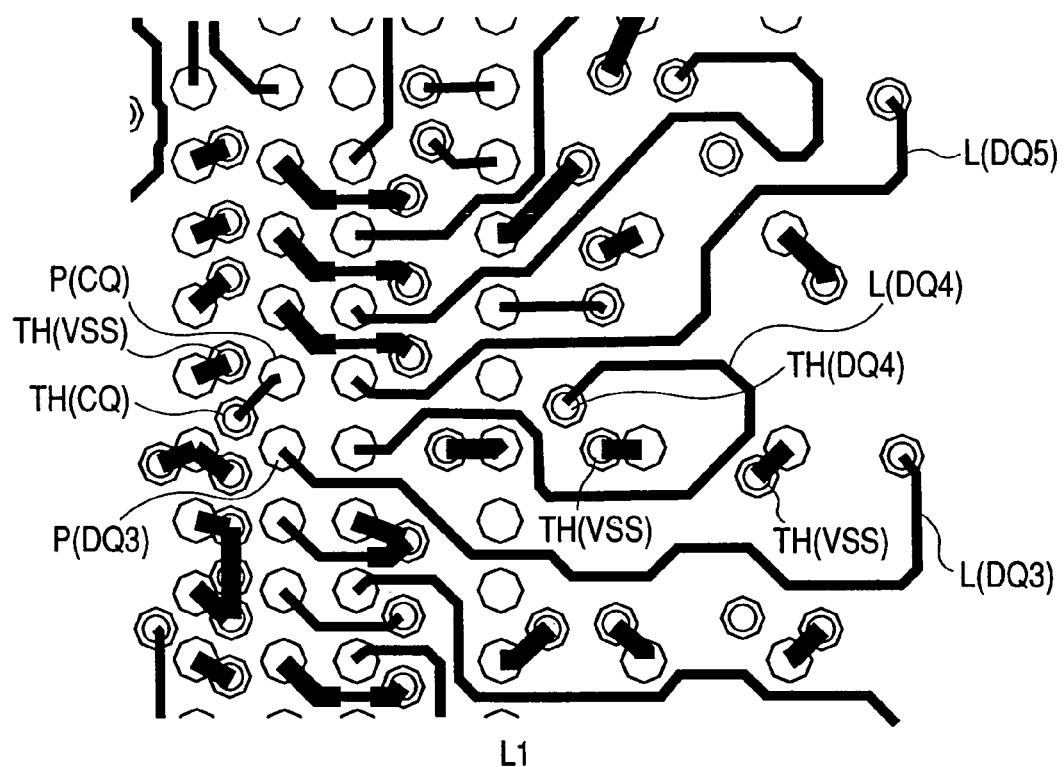
FIG. 14 is a wiring pattern diagram depicting the first wiring layer L1 in the neighborhood of P(CQ), P(DQ3) and P(DQ4) employed in the package substrate at the time that the elimination of overlapping of wirings between wiring layers cannot be realized.
Figure 15:
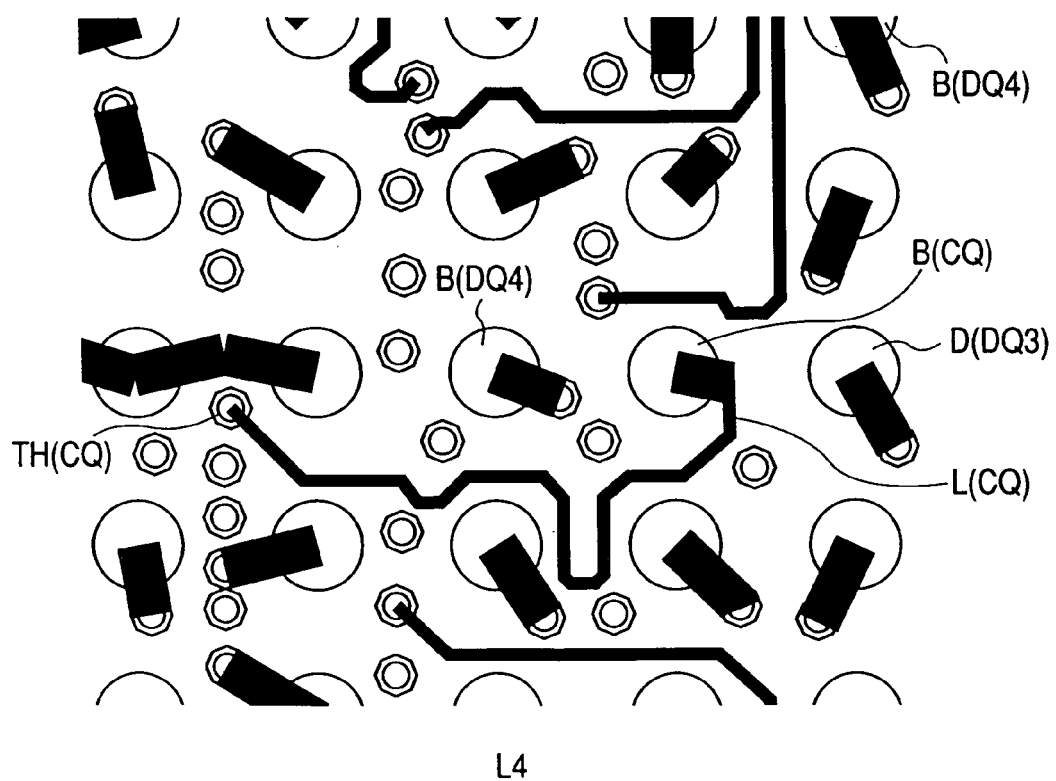
FIG. 15 is a wiring pattern diagram showing part of the fourth wiring layer L4 corresponding to FIG. 14.

An example in which the elimination of overlapping wirings between the wiring layers cannot be realized sufficiently, which is indicative of the third aspect, is shown in each of FIGS. 14 and 15. A wiring L(CQ) shown in FIG. 15 is made large as compared with FIG. 9 at a portion where it is located in parallel with a wiring L(DQ4) located directly thereabove.

Figure 16:
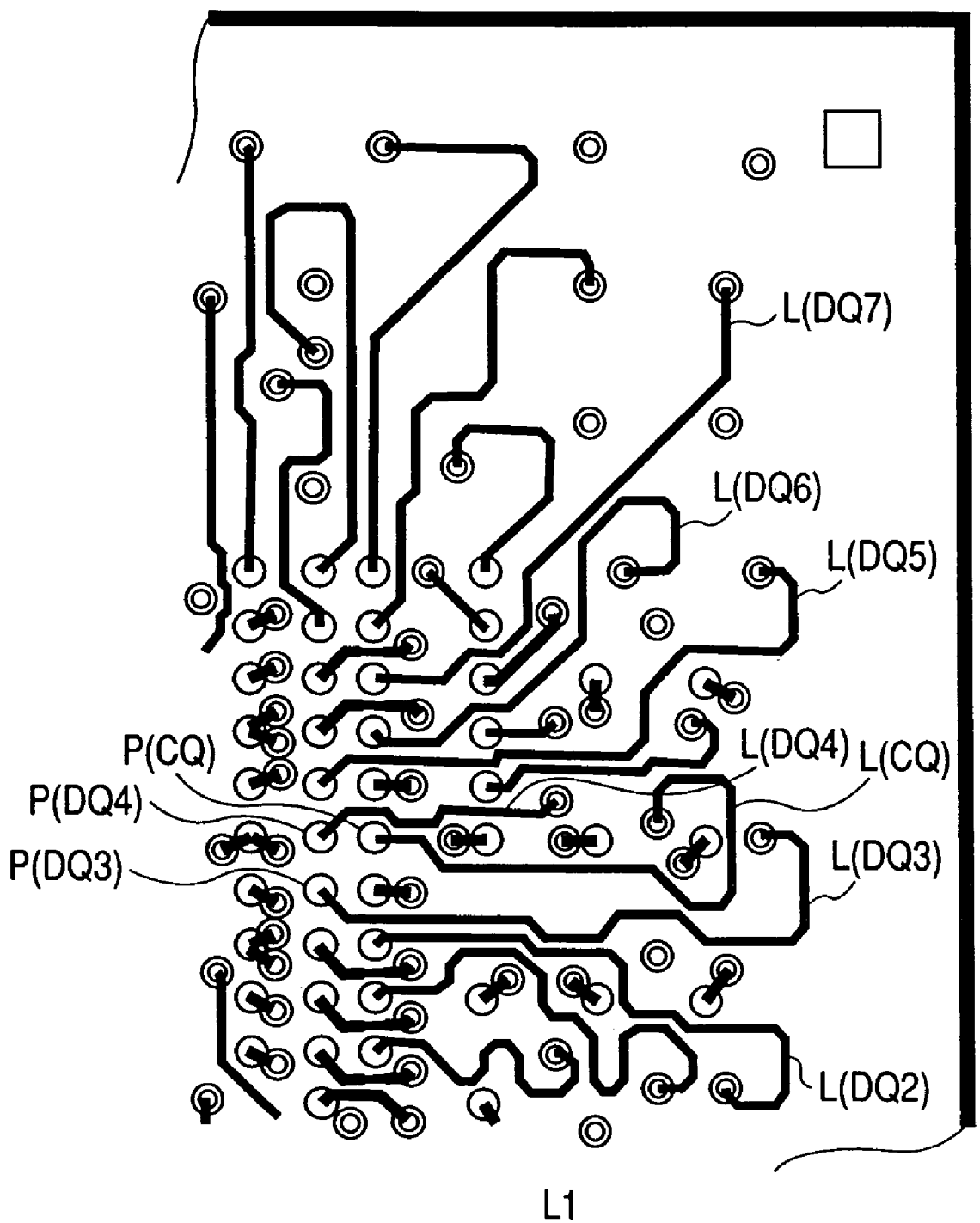
FIG. 16 is a wiring pattern diagram depicting part of a first wiring layer L1 according to a comparative example in which any suppression of crosstalk is not taken into consideration.
Figures 17, 18:
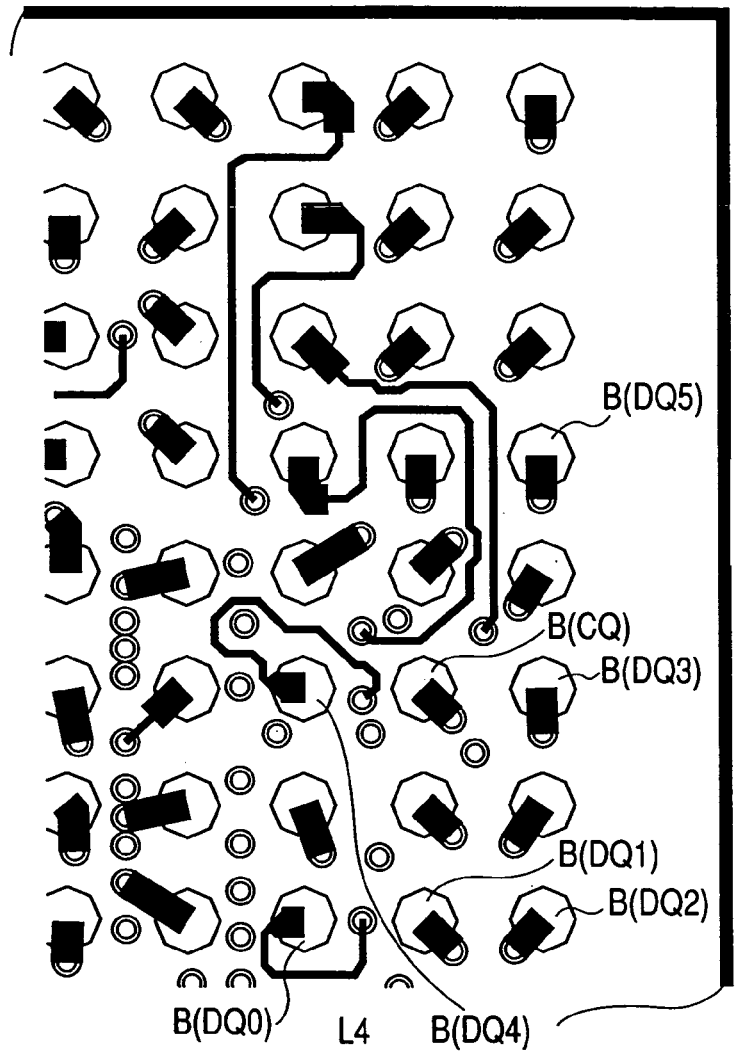
FIG. 17 is a wiring pattern diagram showing part of the fourth wiring layer L4 corresponding to FIG. 16.
FIG. 18 is table illustrating an L matrix between an example according to the present invention and a comparative example.

A first wiring layer L1 and a fourth wiring layer L4, according to a comparative example in which any of the first through third aspects is not taken into consideration, are shown in FIGS. 16 and 17. In the first wiring layer L1, wirings L(DQ3) and L(DQ4) are disposed adjacent to each other with a wiring L(CQ) interposed therebetween.

The effect of improving crosstalk noise by the configuration (example of the present invention) described in FIGS. 8 and 9 will be explained next, based on simulation and actual measurements. As an object to be compared, there is a configuration (comparative example) as shown in FIG. 16 and 17.

Figures 19, 20:
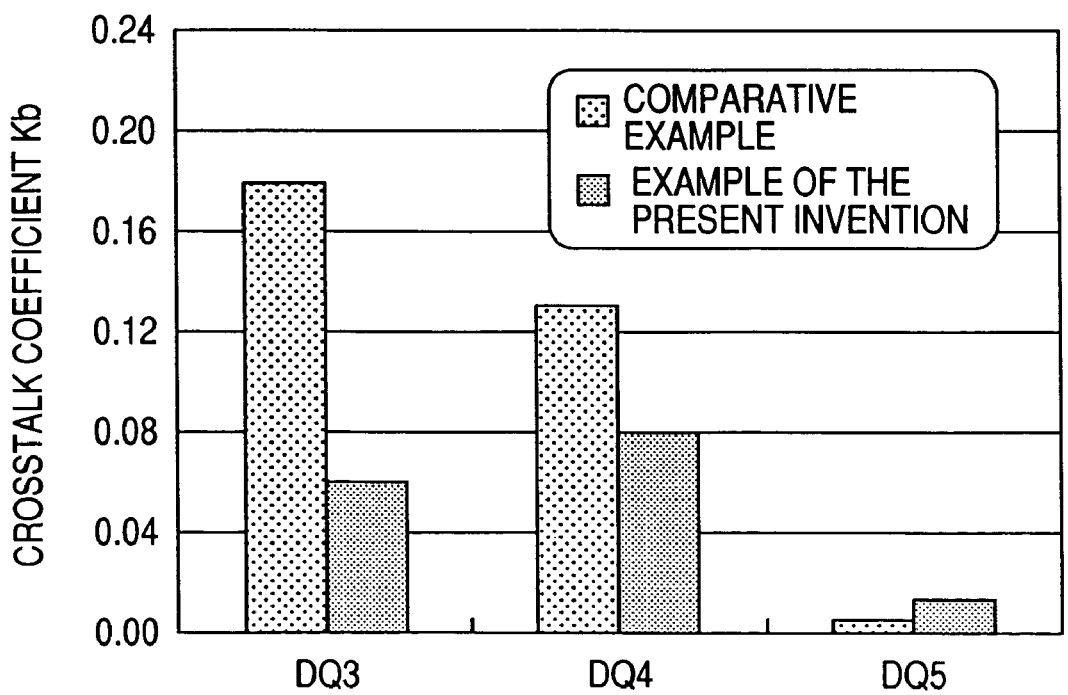
FIG. 19 is table illustrating a C matrix between an example according to the present invention and a comparative example.
FIG. 20 is bar graph showing improved effects of crosstalk noise by a result of simulation of crosstalk coefficients.

In order to estimate the amount of a reduction in crosstalk noise related to a package, crosstalk coefficients were compared by simulation. An L matrix related to an example of the present invention and a comparative example is shown in FIG. 18, and a C matrix related to an example of the present invention and a comparative example is shown in FIG. 19. In FIG. 18, each of the values on opposite angles indicates self inductance, and each of the other values indicates mutual inductance. The unit thereof is expressed in nano henrys (nH). In FIG. 19, each of the values on opposite angles indicates input capacitance, and each of the other values indicates mutual capacitance. The unit thereof is expressed in picofarads (pF).

Crosstalk coefficients of DQ3, DQ4 and DQ5 are determined from the L matrix and C matrix shown in FIGS. 18 and 19. The crosstalk coefficient Kb is determined from the following equation (1):

$$Kb = Lm/L0 + Cm/C0 \quad (1)$$

In the equation, Lm indicates mutual inductance, L0 indicates self inductance, Cm indicates mutual capacitance, and C0 indicates input capacitance. Since L0 and C0 of CQ and DQ in the L matrix and C matrix shown in FIGS. 18 and 19 are different, L0 and C0 in the equation (1) are expressed by the following equations (2) and (3):

$$L0=\sqrt{\{L0(CQ) \times L0(DQ)\}} \quad (2)$$

$$C0=\sqrt{\{C0(CQ) \times C0(DQ)\}} \quad (3)$$

A result of the simulation referred to above is illustrated in FIG. 20. The crosstalk coefficients of DQ3 and DQ4 according to the example of the present invention were reduced ⅓–⅔ with respect to the comparative example.

Figure 21:
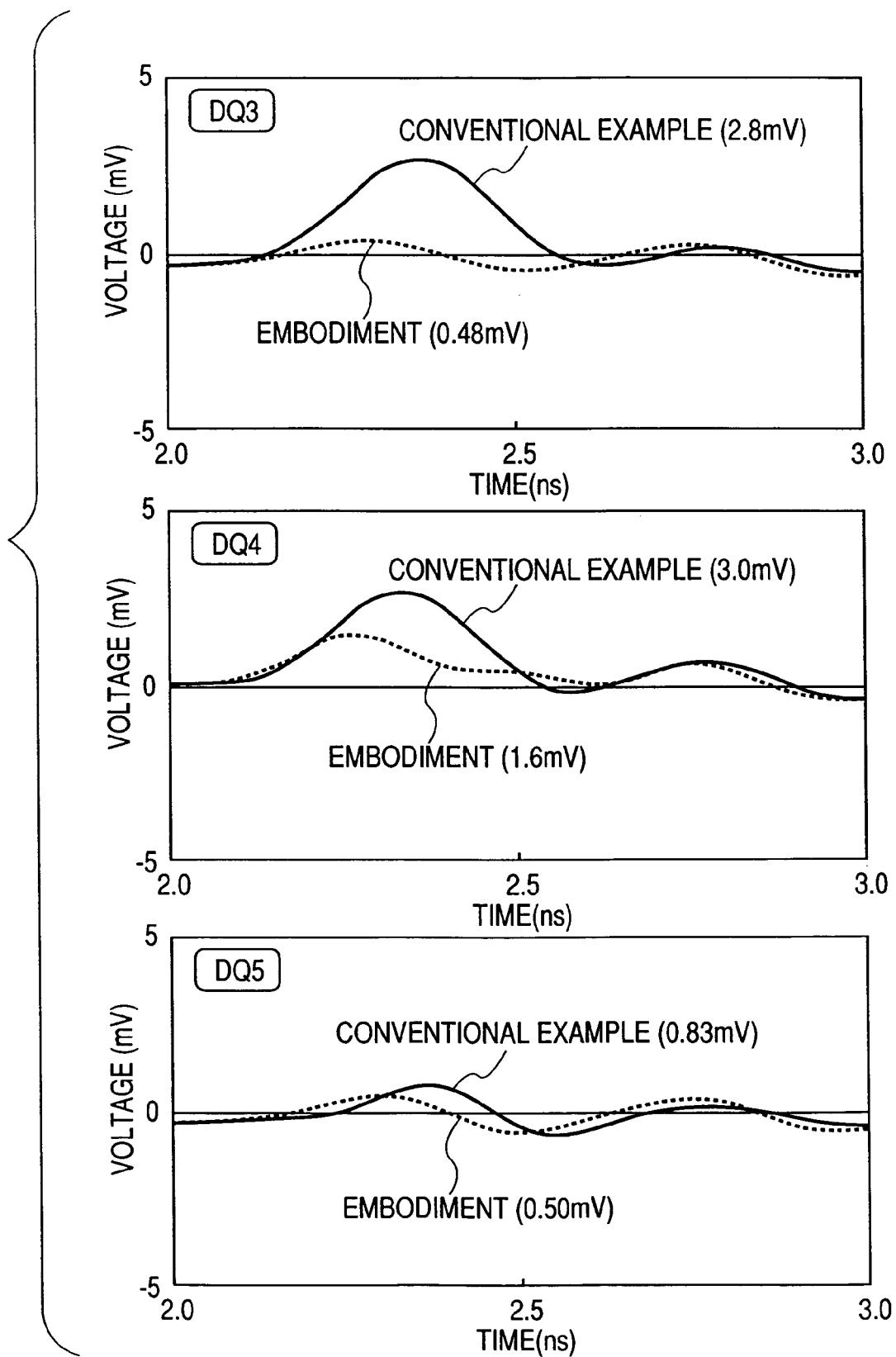
FIG. 21 is a waveform diagram illustrating TDT waveforms at the time that the time Tr required to raise each of DQ3, DQ4 and DQ5=200 ps, by comparisons among examples according to the present invention and comparative examples.

A result obtained by comparing crosstalk noise of the packages according to the example of the present invention and the comparative example by TDT (Time Domain Transmission) measurement will be explained next. TDT waveforms where rise times of signals at DQ3, DQ4 and DQ5 are Tr=200 ps, are shown in FIG. 21 by comparison between the example of the present invention and the comparative example. Referring to FIG. 21, noise at the solder ball electrode B(DQ3), where Tr=200 ps, is improved to about ⅕, and noise at the solder ball electrode B(DQ4) is improved to about ½. Thus, when the SRAM is operated at Tr=200 ps, it is considered that the crosstalk noise of the example of the present invention can be reduced to such a degree as compared with the comparative example.

It is apparent from the simulation and actual measurements that the above-described configuration, in which the wiring at the CQ terminal corresponding to the noise source is configured as the L4 layer and shielded from the DQ terminal, brings about the effect of reducing the crosstalk noise between the signal at the terminal CQ and the signal at the terminal DQ.

While countermeasures against the crosstalk noise relative to the package substrate have been described above, its consideration on the semiconductor chip 3 side will be explained. As illustrated in FIG. 2, by way of example, bump electrodes corresponding to terminals CQ, of the bump electrodes 8 of the semiconductor chip 3, are placed at an end of a bump electrode array corresponding to data input/output terminals DQ. Further, bump electrodes for a plurality of power supply terminals VDD and ground terminals are disposed around the bump electrodes corresponding to the terminals CQ. Accordingly, the influence of crosstalk due to relocating wirings 10 or the like from pad electrodes 9 on the semiconductor chip to their corresponding bump electrodes 8 can be relaxed or suppressed.

Further, a bump electrode for a clock terminal CQ is spaced relatively far away from an array of bump electrodes corresponding to a plurality of data input/output terminals DQ. Thus, it is advisable to keep the relocating wirings and the wirings in the chip equal with respect to both signal paths for the purpose of obtaining a satisfactory timing margin. Taking this into consideration makes it possible to adopt adjusting delay means against input stages of paths for the clock CK1 to the output registers 11 and 12 in FIG. 3, by way of example, to cope with length inequality of a data input/output path. The delay means may be a gate delay or a bypass wiring path.

<<Countermeasures Against Crosstalk Noise at a Synchronous DRAM Controller>>

The above-described crosstalk noise countermeasures are not limited to a synchronous SRAM, but are applicable even to a memory interface or a memory controller for a synchronous DRAM. Now consider a data processor equipped with a synchronous DRAM controller as a semiconductor chip 3. As described with respect to FIG. 1, the data processor is mounted over the package substrate 2 as a semiconductor chip 3 in a semiconductor device having a CSP configuration.

Figure 22:
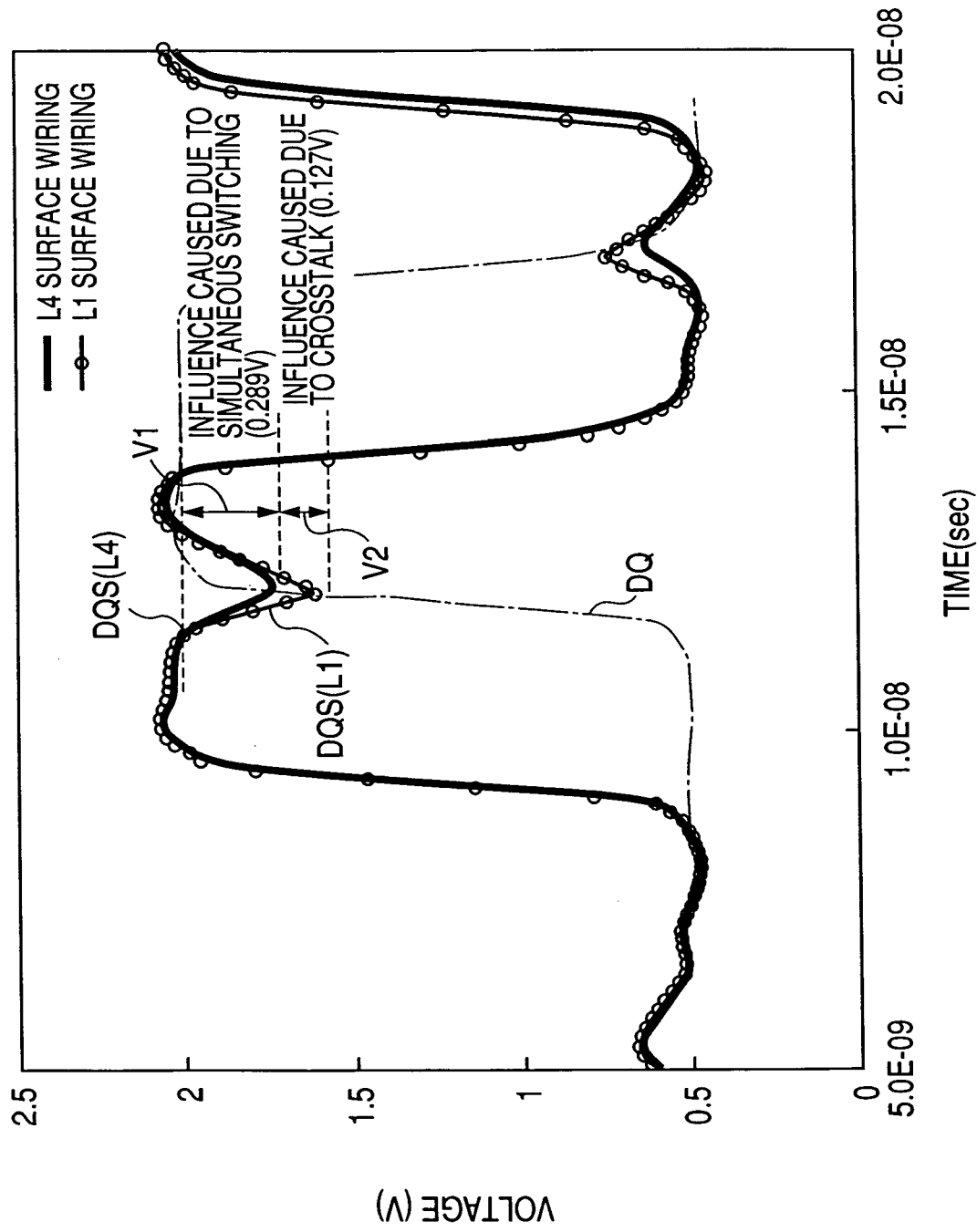
FIG. 22 is a simulation waveform diagram showing problems of a data strobe signal DQS and write data DQ.

Simulation waveforms of a data strobe signal DQS and write data DQd are illustrated in FIG. 22. In particular, data strobe signal waveforms are illustrated, with a signal waveform DQS(L4) formed over the wiring of the fourth wiring layer L4 of the package substrate and a signal waveform DQS(L1) formed over the wiring of the first wiring layer L1 of the package substrate being distinguished from each other.

Figure 23:
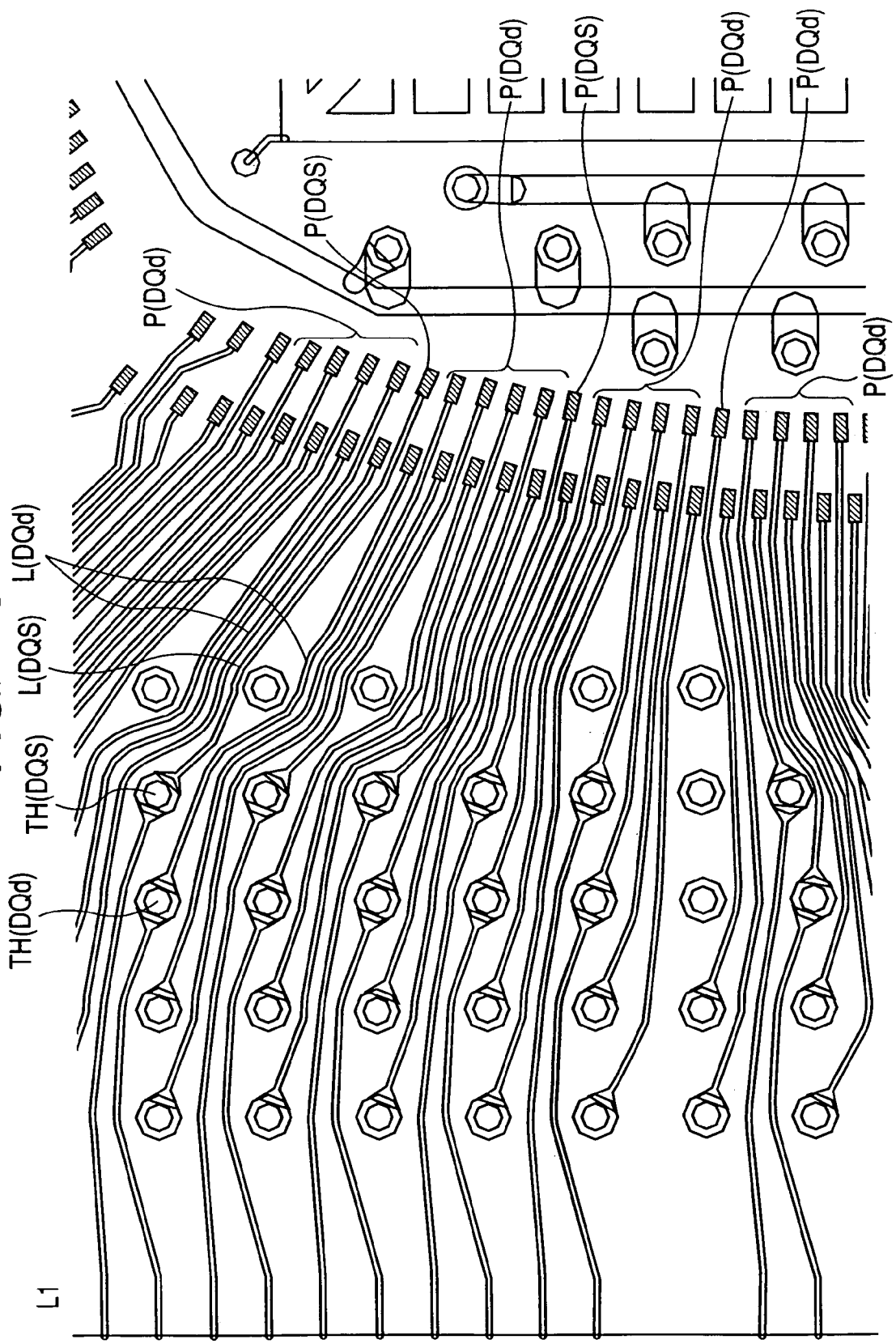
FIG. 23 is a wiring pattern diagram of a first wiring layer L1 of a package substrate, which is configured as a premise of the simulation waveform.
Figure 24:
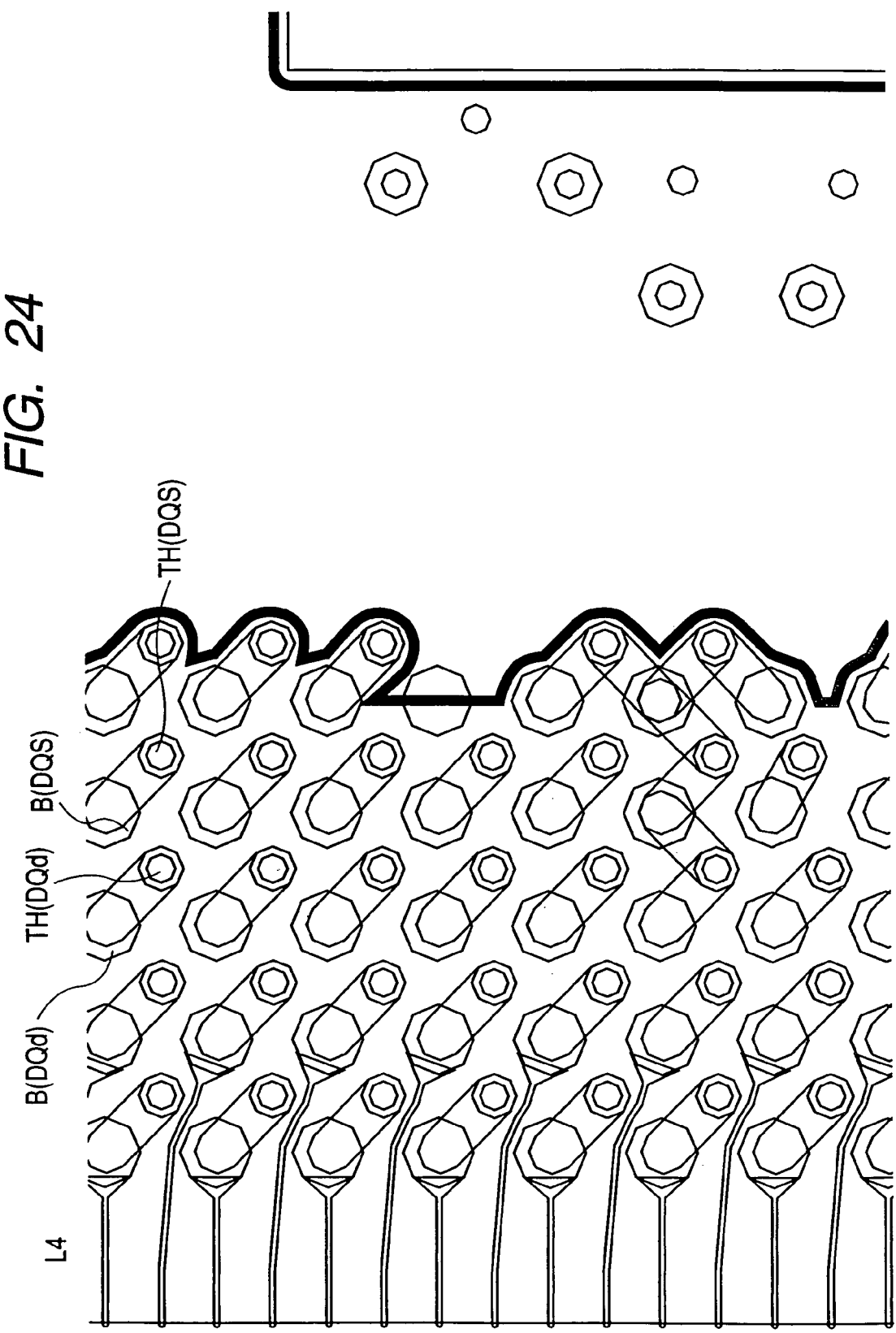
FIG. 24 is a wiring pattern diagram of a fourth wiring layer L4 of the package substrate, which is configured as a premise of the simulation waveform.

The synchronous DRAM controller outputs the data strobe signal DQS together with the output of the write data DQd. According to interface specs of the synchronous DRAM, however, the synchronous DRAM controller first changes the rising edge of the data strobe signal DQS and thereafter outputs write data DQd of plural bits. The strobe signal waveform is affected not a little by power supply noise due to the parallel output of the write data of plural bits. In addition to the above, a data output terminal and an output terminal for the data strobe signal both located over the semiconductor chip 3 cannot be extremely separated from each other to minimize a shift in timing or skew between signals. Therefore, the data strobe signal DQS is considered to be affected by crosstalk noise relative to the output data DQd, particularly, inductive coupling noise in the same manner as described above. In FIG. 22, a high level of the data strobe signal DQS drops in the course thereof. V1 means indicates influence caused by the power supply noise, and V2 indicates an influence caused by crosstalk. The influence of the crosstalk is considered to result from the fact that the principal wiring routing of paths extending from data input/output electrode pads P(DQd) of FIG. 23 to data input/output solder ball electrodes B(DQd) of FIG. 24 is carried out within the first wiring layer L1; the principal wiring routing of paths extending from electrode pads P(DQS) for a data strobe signal of FIG. 23 to solder ball electrodes B(DQS) for a data strobe signal of FIG. 24 is similarly performed within the first wiring layer L1; and data signal wirings L(DQd) are arranged in parallel on both sides of a wiring L(DQS) for the data strobe signal within the first wiring layer L1.

Figure 25:
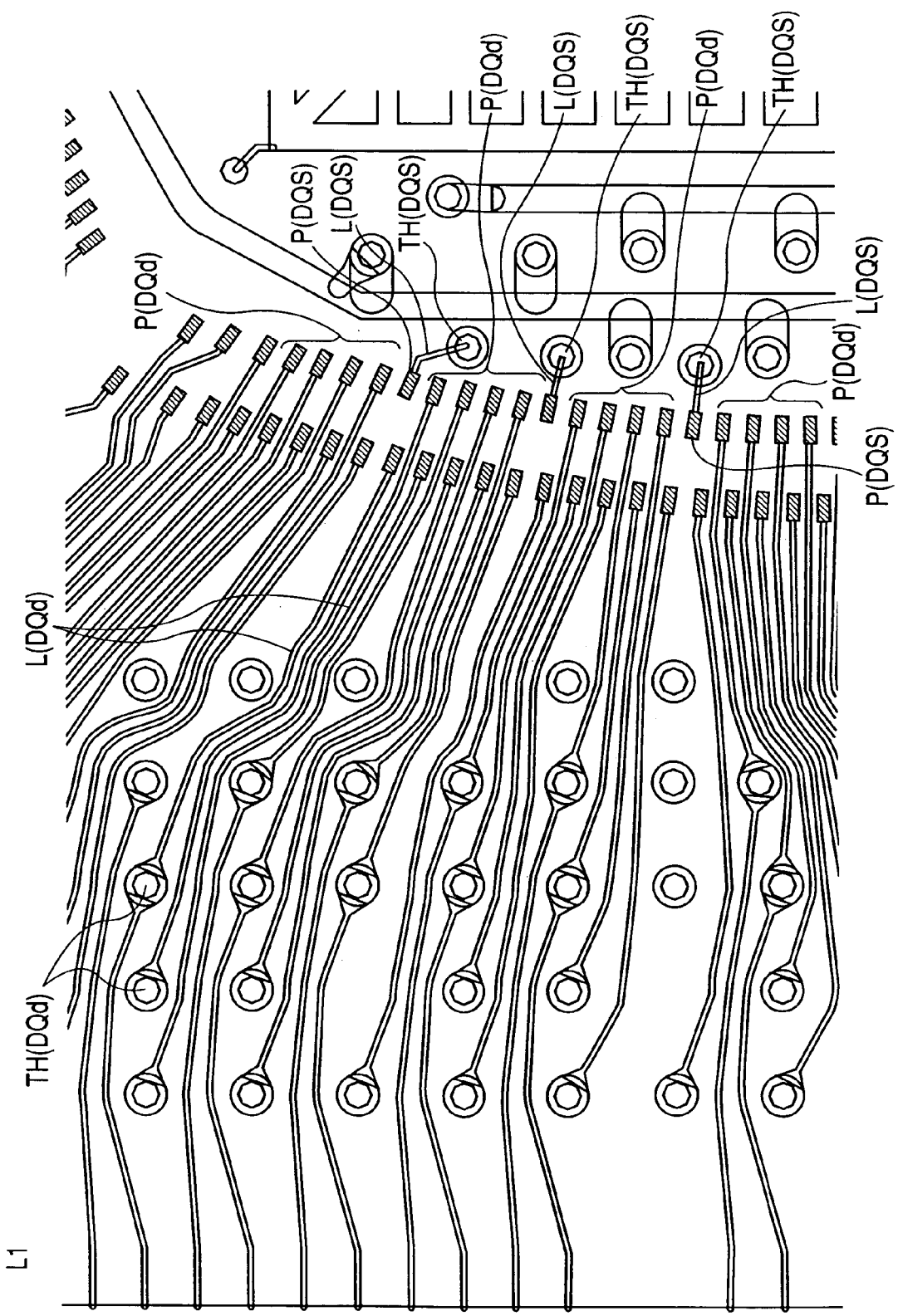
FIG. 25 is a wiring pattern diagram of the first wiring layer L1 of the package substrate, which has suppressed crosstalk between wirings L(DQS) for a data strobe signal and wirings L (DQd) for a data signal.
Figure 26:
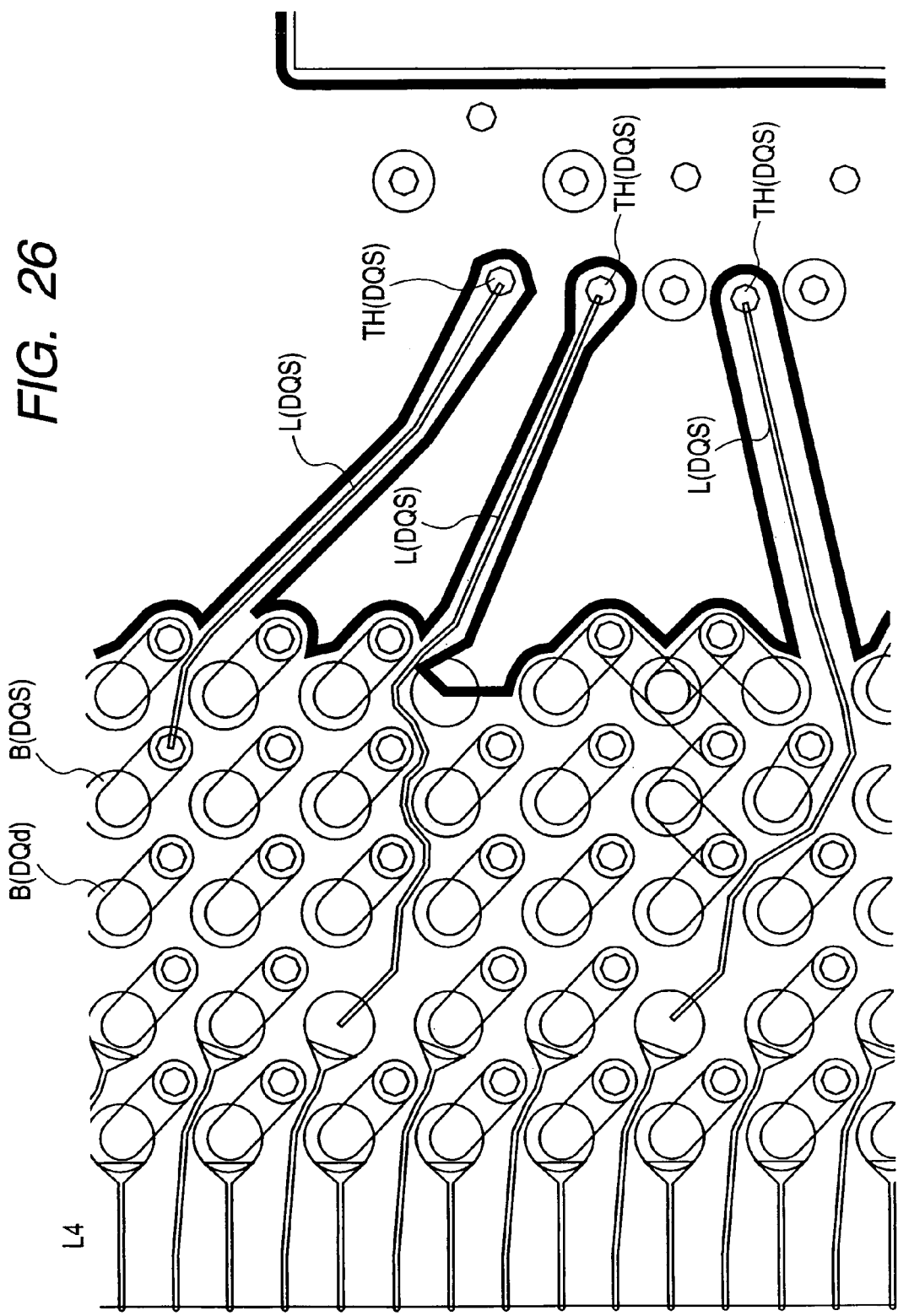
FIG. 26 is a wiring pattern diagram of the fourth wiring layer L4 of the package substrate, which has suppressed crosstalk between wirings L (DQS) for a data strobe signal and wirings L (DQd) for a data signal.

A configuration of wiring layers, which will suppress crosstalk between the wirings L(DQS) for the data strobe signal and the wirings L(DQd) for the data signal, is illustrated in each of FIGS. 25 and 26. In a first wiring layer L1, as shown in FIG. 25, electrode pads P(DQS) for the data strobe signal are led out to the side opposite to the direction of pulling out of data input/output wirings L(DQd) through short wirings L(DQS) and are connected to corresponding vias TH(DQS). In a fourth wiring layer L4, as shown in FIG. 26, the vias TH(DQS) are connected to their corresponding solder ball electrodes B(DQS) for the data strobe signal through relatively long wirings L(DQS). Consequently, the principal wiring routing of paths extending from electrode pads P(DQd) for data input/output of FIG. 25 to their corresponding solder ball electrodes B(DQd) for data input/output of FIG. 26 is performed within the first wiring layer L1. On the other hand, the principal wiring routing of paths extending from the electrode pads P(DQS) for the data strobe signal of FIG. 25 to their corresponding solder ball electrodes B(DQS) for the data strobe signal of FIG. 26 is performed within the fourth wiring layer L4. In the first wiring layer L1 and the fourth wiring layer L4, no data signal wirings L(DQd) are arranged in a line on both sides of the wiring L(DQS) for the data strobe signal. Thus, an undesired reduction in level of the data strobe signal due to noise does not occur at a data output timing, and the occurrence of a write error in the synchronous DRAM can be prevented before it happens.

While the invention made by the present inventors has been described specifically on the basis of the preferred embodiments thereof, the present invention is not limited to the embodiments referred to above. It is needless to say that various changes can be made thereto within a scope not departing from the gist thereof.

For example, the present invention is not limited to application to a synchronous SRAM or a synchronous DRAM controller. The present invention is applicable as well to another type of memory or controller. The present invention can widely be applied to wirings lying over a package or wiring board between signals, in which signal terminals are disposed adjacent to one another, in which synchronization is taken, as in the case of data and its corresponding strobe signal or timing signal. The strobe signal is not limited to a free running clock or an echo clock.

The wiring board is not limited to one having four layers, but can suitably be changed. Also, the wiring board is not limited to a configuration having a ground plane and a power supply plane. The wiring board is not limited to a ceramic substrate. The wiring board equipped with a semiconductor chip is not limited to a CSP type package substrate.

What is claimed is:

1. A semiconductor device comprising:
a semiconductor chip mounted over a wiring board,
wherein the wiring board has a plurality of wiring layers and has one surface formed with a plurality of chip connecting electrodes connected to the semiconductor chip and the other surface formed with a plurality of external connecting electrodes of the semiconductor device, said wiring board including wirings formed in the wiring layers and vias that connect the wirings among the wiring layers to connect the chip connecting electrodes and external connecting electrodes associated with one another,
wherein the plurality of chip connecting electrodes include first chip connecting electrodes each used in an interface for a first signal whose logic value changes in a predetermined timing, and second chip connecting electrodes each used in an interface for a second signal having a timing at which a logic value thereof changes after the change timing of the first signal, and
wherein a wiring layer in which wiring routing of paths extending from the first chip connecting electrodes to their corresponding first external connecting electrodes is principally performed, and a wiring layer in which wiring routing of paths extending from the second chip connecting electrodes disposed adjacent to the first chip connecting electrodes to their corresponding second external connecting electrodes is principally performed, are made different from each other.

2. A semiconductor device according to claim 1, wherein the different wiring layers are respectively disposed over a surface of the wiring board and a back surface thereof with a wiring layer having a power supply plane and a wiring layer having a ground plane being interposed therebetween.

3. A semiconductor device according to claim 2, wherein wirings for the paths extending from the first chip connecting electrodes to their corresponding first external connecting electrodes in one wiring layer, and wirings for the paths extending from the second chip connecting electrodes disposed adjacent to the first chip connecting electrodes to their corresponding second external connecting electrodes in the other wiring layer respectively have layouts that intersect between the wiring layers.

4. A semiconductor device according to claim 2, wherein vias each connected to the ground plane are respectively individually adjacent to vias for the paths extending from the first chip connecting electrodes to their corresponding first external connecting electrodes and vias for the paths extending from the second chip connecting electrodes disposed adjacent to the first chip connecting electrodes to their corresponding second external connecting electrodes.

5. A semiconductor device according to claim 1, wherein the first signal is input data, and the second signal is an output clock.

6. A semiconductor device according to claim 5, wherein the output clock is a free running echo clock, and the semiconductor chip is a synchronous SRAM.

7. A semiconductor device according to claim 1, wherein the first signal is an output clock, and the second signal is output data.

8. A semiconductor device according to claim 7, wherein the output clock is a data strobe signal, and the semiconductor chip is a data processor having a synchronous DRAM interface.

9. A semiconductor device according to claim 1, wherein the semiconductor chip has a plurality of bump electrodes respectively connected to the plurality of chip connecting electrodes, and second bump electrodes corresponding to the second chip connecting electrodes are located at an end of an array of first bump electrodes corresponding to the first chip connecting electrodes.

10. A semiconductor device comprising:
a semiconductor chip mounted over a wiring board,
wherein the wiring board has a plurality of wiring layers and has one surface formed with a plurality of chip connecting electrodes connected to the semiconductor chip and the other surface formed with a plurality of external connecting electrodes of the semiconductor device,
wherein the plurality of chip connecting electrodes include first chip connecting electrodes each used in an interface for a first signal whose logic value changes in a predetermined timing, and second chip connecting electrodes each used in an interface for a second signal having a timing at which a logic value thereof changes after the change timing of the first signal, and
wherein, of wirings for paths extending from the first chip connecting electrodes to their corresponding first external connecting electrodes and wirings for paths extending from the second chip connecting electrodes to their corresponding second external connecting electrodes, the wirings having sections arranged in parallel adjacent to one another are provided such that the sections thereof provided in the wiring layers different from one another become longer than the sections thereof arranged in parallel to one another within the same wiring layer.

11. A semiconductor device according to claim 10, wherein the first signal is input data, and the second signal is an output clock.

12. A semiconductor device according to claim 11, wherein the output clock is a free running echo clock, and the semiconductor chip is a synchronous SRAM.

13. A semiconductor device according to claim 10, wherein the first signal is an output clock, and the second signal is output data.

14. A semiconductor device according to claim 13, wherein the output clock is a data strobe signal, and the semiconductor chip is a data processor having a synchronous DRAM interface.

15. A semiconductor device comprising:
a semiconductor chip mounted over a wiring board,
wherein the wiring board has a plurality of wiring layers and has one surface formed with a plurality of chip connecting electrodes connected to the semiconductor chip and the other surface formed with a plurality of external connecting electrodes of the semiconductor device, said wiring board including wirings formed in the wiring layers and vias that connect the wirings among the wiring layers to connect the chip connecting electrodes and external connecting electrodes associated with one another,
wherein the plurality of chip connecting electrodes include first chip connecting electrodes each used in an interface for a first signal whose logic value changes in a predetermined timing, and second chip connecting electrodes each used in an interface for a second signal having a timing at which a logic value thereof changes after the change timing of the first signal, and
wherein vias each connected to the ground plane are respectively individually adjacent to vias for paths extending from the first chip connecting electrodes to their corresponding first external connecting electrodes and vias for paths extending from the second chip connecting electrodes disposed adjacent to the first chip connecting electrodes to their corresponding second external connecting electrodes.

16. A semiconductor device according to claim 15, wherein the first signal is input data, and the second signal is an output clock.

17. A semiconductor device according to claim 16, wherein the output clock is a free running echo clock, and the semiconductor chip is a synchronous SRAM.

18. A semiconductor device according to claim 15, wherein the first signal is an output clock, and the second signal is output data.

19. A semiconductor device according to claim 18, wherein the output clock is a data strobe signal, and the semiconductor chip is a data processor having a synchronous DRAM interface.

* * * * *